United States Patent
Sullivan et al.

(10) Patent No.: US 10,653,016 B1
(45) Date of Patent: May 12, 2020

(54) FACIAL-INTERFACE CUSHION, SYSTEM, AND METHOD FOR HEAD-MOUNTED DISPLAYS

(71) Applicant: FACEBOOK TECHNOLOGIES, LLC, Menlo Park, CA (US)

(72) Inventors: Joseph Patrick Sullivan, Seattle, WA (US); Shane Michael Ellis, Bellevue, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 15/616,539

(22) Filed: Jun. 7, 2017

(51) Int. Cl.
| | |
|---|---|
| G06F 1/16 | (2006.01) |
| G02B 27/00 | (2006.01) |
| H05K 5/00 | (2006.01) |
| G02B 27/01 | (2006.01) |
| H05K 5/02 | (2006.01) |
| H04R 1/10 | (2006.01) |
| H04N 13/344 | (2018.01) |

(52) U.S. Cl.
CPC ....... H05K 5/0017 (2013.01); G02B 27/0176 (2013.01); H05K 5/0217 (2013.01); H04N 13/344 (2018.05); H04R 1/105 (2013.01); H04R 1/1008 (2013.01)

(58) Field of Classification Search
CPC .............. H05K 5/0017; H05K 5/0217; G02B 27/0176; G06F 1/1616
See application file for complete search history.

(56) References Cited

U.S. PATENT DOCUMENTS

| | | | |
|---|---|---|---|
| 3,012,283 A | 12/1961 | Foster et al. | |
| 4,241,131 A | 12/1980 | Bailey | |
| 5,050,240 A * | 9/1991 | Sayre | A42B 3/122 2/6.2 |
| 8,605,008 B1 | 12/2013 | Prest | |
| 9,332,337 B2 | 5/2016 | Ridler | |
| 9,778,467 B1 | 10/2017 | White | |

(Continued)

OTHER PUBLICATIONS

STIC search report (Year: 2019).*

(Continued)

*Primary Examiner* — Daniel P Wicklund
*Assistant Examiner* — Christopher L Augustin
(74) *Attorney, Agent, or Firm* — FisherBroyles, LLP

(57) ABSTRACT

A method for manufacturing a facial-interface cushion for a head-mounted display may include (1) positioning a foam layer between a recessed mold member and an insertion mold member of a mold assembly, with the foam layer overlapping at least a portion of a mold channel extending along an arcuate path, the foam layer including a reticulated foam material, (2) forcing the insertion mold member against the foam layer in a direction toward the recessed mold member such that at least a portion of the foam layer is forced into the mold channel toward a channel bottom surface, forming a shaped foam element having a curved surface within the mold channel, (3) heating the shaped foam element to soften the shaped foam element and form the facial-interface cushion, and (4) removing the facial-interface cushion from the mold assembly. Various other facial-interface cushions, systems, and methods for head-mounted displays are also disclosed.

8 Claims, 12 Drawing Sheets

(56) References Cited

U.S. PATENT DOCUMENTS

| | | | | |
|---|---|---|---|---|
| 10,045,449 | B1* | 8/2018 | Yee | G02B 27/0176 |
| 10,133,305 | B1* | 11/2018 | Sullivan | G06F 1/163 |
| 2006/0154567 | A1 | 7/2006 | Jung-Shun | |
| 2006/0179554 | A1 | 8/2006 | Barton | |
| 2009/0287282 | A1 | 11/2009 | Biser | |
| 2011/0225709 | A1 | 9/2011 | Saylor | |
| 2012/0070027 | A1 | 3/2012 | Ridler | |
| 2012/0255104 | A1 | 10/2012 | Didier | |
| 2014/0139407 | A1* | 5/2014 | Abdollahi | G02B 27/0176 345/8 |
| 2015/0238361 | A1 | 8/2015 | McCulloch | |
| 2017/0090514 | A1* | 3/2017 | Byun | G06F 1/166 |
| 2017/0094816 | A1 | 3/2017 | Yun | |
| 2017/0153672 | A1* | 6/2017 | Shin | G06F 1/163 |
| 2017/0168303 | A1* | 6/2017 | Petrov | G02B 27/0176 |
| 2017/0248990 | A1* | 8/2017 | Chen | G06F 1/163 |
| 2017/0255019 | A1* | 9/2017 | Lyons | G02B 27/0172 |
| 2017/0276944 | A1* | 9/2017 | Kim | G02B 26/007 |
| 2017/0337737 | A1* | 11/2017 | Edwards | G06T 19/006 |
| 2017/0343810 | A1* | 11/2017 | Bietry | G02B 27/0172 |
| 2018/0027676 | A1* | 1/2018 | Araki | H05K 5/0221 |
| 2018/0113524 | A1* | 4/2018 | Osterhout | G06F 3/04842 |
| 2018/0253159 | A1* | 9/2018 | Ramaiah | G06F 3/0346 |

OTHER PUBLICATIONS

Thermoplastic Polyurethane Elastomers (TPU): Elastollan—Material Properties; http://www.polyurethanes.basf.de/pu/solutions/us/function/conversions:/publish/content/group/Arbeitsgebiete_und_Produkte/Thermoplastische_Spezialelastomere/Infomaterial/elastollan_material_uk.pdf, Nov. 2011.

Joseph Patrick Sullivan et al.; Facial-Interface Systems for Head-Mounted Displays; U.S. Appl. No. 15/495,775, filed Apr. 24, 2017.

Joseph Patrick Sullivan et al.; Facial-Interface Cushion, System, and Method for Head-Mounted Displays; U.S. Appl. No. 15/594,263, filed May 12, 2017.

New Oculus Rift Facial Interfaces with Replacement Foam Pads; https://www.kickstarter.com/projects/1869563556/new-oculus-rift-facial-interfaces-with-replacement; as accessed Jun. 20, 2017 (dated Jul. 6, 2016).

VR Cover; Oculus Rift Facial Interface & Foam Replacement Standard Set; https://vrcover.com/product/oculus-rift-facial-interface-foam-replacement-standard-set-2/; as accessed Jun. 20, 2017.

Greenbaum; Sport / Hygienic Interface for Head Mounted Display; https://nyvirtualreality.wordpress.com/2014/02/26/sport-hygienic-interface-for-head-mounted-display/; as accessed Jun. 20, 2017 (dated Feb. 26, 2014).

Greenbaum; Exercise Hmd: Update; https://nyvirtualreality.wordpress.com/2014/04/07/exercise-hmd-update/; as accessed Jun. 20, 2017 (dated Apr. 7, 2014).

UFP Technologies; Reticulated Polyurethane Foam; https://www.ufpt.com/materials/foam/reticulated-polyurethane-foam.html?utm_source=google&utm_medium=cpc&utm_term=reticulated%252Bfoam&utm_content=polyurethane-foam&utm_campaign=foam&gclid=CI2Xj4Do6tMCFQ5xfgodxIQOpg; as accessed Jun. 20, 2017.

Flextech, Inc.; About Compression Molding; http://www.flextechfoam.com/production-capabilities/compression-molding/; as accessed Jun. 20, 2017.

* cited by examiner

FACIAL-INTERFACE CUSHION, SYSTEM, AND METHOD FOR HEAD-MOUNTED DISPLAYS

BACKGROUND

Putting on a virtual reality headset may be the beginning of a thrilling experience, one that may be more immersive than almost any other digital entertainment or simulation experience available today. Virtual reality headsets may enable users to travel through space and time, interact with friends in a three-dimensional world, or play video games in a radically redefined way. Virtual reality headsets may also be used for purposes other than recreation—governments may use them for military training simulations, doctors may use them to practice surgery, and engineers may use them as visualization aids.

Conventional virtual reality headset systems may include cushioned facial interfaces that allow users to position the headsets on their faces. Unfortunately, while these cushioned facial interfaces often include cushions that directly contact a user's face, the cushions are commonly die-cut from foam sheets resulting in angular edges that may uncomfortably dig into the user's skin and leave marks on the user's face. Additionally, such cushions may poorly dissipate heat during use, resulting in discomfort to the user and fogging of the headset lenses and eyeglasses worn by the user. While covers may be placed over the cushions to mitigate discomfort from the angular foam edges, such covers may add undesirable bulk to the facial interfaces and may further prevent dissipation of heat during use.

SUMMARY

As will be described in greater detail below, the instant disclosure generally relates to facial-interface cushions, systems, and methods for head-mounted displays. In one example, a method for manufacturing a facial-interface cushion for a head-mounted display may include (1) positioning a foam layer for producing a facial-interface cushion for a head-mounted display between a recessed mold member and an insertion mold member of a mold assembly, the foam layer overlapping at least a portion of a mold channel defined in the recessed mold member and the mold channel extending along an arcuate path, the foam layer comprising a reticulated foam material, (2) forcing the insertion mold member against the foam layer in a direction toward the recessed mold member such that at least a portion of the foam layer is forced into the mold channel defined in the recessed mold member toward a channel bottom surface, forming a shaped foam element having a curved surface within the mold channel, (3) heating the shaped foam element to soften the shaped foam element and form the facial-interface cushion, and (4) removing the facial-interface cushion from the mold assembly.

In at least one embodiment, the method may further include cutting the foam layer from a foam sheet prior to positioning the foam layer between the recessed mold member and the insertion mold member. In some embodiments, the curved surface of the shaped foam element may not contact at least a portion of the recessed mold member defining the mold channel. In at least one embodiment, at least a portion of the curved surface of the shaped foam element may contact a curved surface of the recessed mold member defining at least a portion of the mold channel.

In some embodiments, the shaped foam element may be entirely disposed within the mold channel defined in the recessed mold member. According to at least one embodiment, a portion of the shaped foam element may be disposed outside the mold channel defined in the recessed mold member. In this example, the portion of the shaped foam element disposed outside the mold channel may be compressed between a surface of the recessed mold member and a surface of the insertion mold member facing the surface of the recessed mold member. In at least one embodiment, the mold channel defined in the recessed mold member may extend along a looped path.

In some embodiments, the insertion mold member may include a protruding portion sized to fit within the mold channel defined in the recessed mold member. In this example, forcing the insertion mold member against the foam layer may further include forcing the protruding portion of the insertion mold member against a portion of the foam layer overlapping at least the portion of the mold channel defined in the recessed mold member. The protruding portion of the insertion mold member may form a foam channel defined within the shaped foam element.

In some embodiments, the reticulated foam material may include at least one of a thermoplastic material or a thermosetting material. In at least one embodiment, the reticulated foam material may include a polyurethane material. Additionally or alternatively, the foam layer may include a plurality of separate layers.

A corresponding head-mounted-display cushion may include (1) a molded reticulated foam material, (2) a user-side surface dimensioned to abut a facial portion of a user, (3) a display-side surface dimensioned to abut a mounting surface of a facial-interface system for a head-mounted display, and (4) a curved surface arcing from the user-side surface toward the display-side surface.

In some embodiments, the head-mounted-display cushion may further define an opening extending through an interior of the head-mounted-display cushion from the user-side surface to the display-side surface. In this example, the curved surface may define at least a portion of the opening. The head-mounted-display cushion may also include an inner side surface defining at least a portion of the opening and a sloped surface sloping between the curved surface and the inner side surface.

In some embodiments, the curved surface may be located on at least a portion of an outer periphery of the head-mounted-display cushion. In at least one embodiment, the head-mounted-display cushion may define a foam channel extending into the head-mounted-display cushion from the display-side surface. According to some embodiments, the display-side surface may include a generally planar surface. According to at least one embodiment, a thickness of the head-mounted-display cushion may be least in a region shaped to abut a nasal region of the user's face. In some embodiments, the molded reticulated foam material may include a polyurethane material.

Similarly, a head-mounted-display system may include (1) a head-mounted display, (2) a facial-interface mounting member for the head-mounted display, and (3) a facial-interface cushion abutting the facial-interface mounting member. The facial-interface cushion may include (1) a molded reticulated foam material, (2) a user-side surface dimensioned to abut a facial portion of a user, (3) a display-side surface dimensioned to abut the facial-interface mounting member, and (4) a curved surface arcing from the user-side surface toward the display-side surface.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
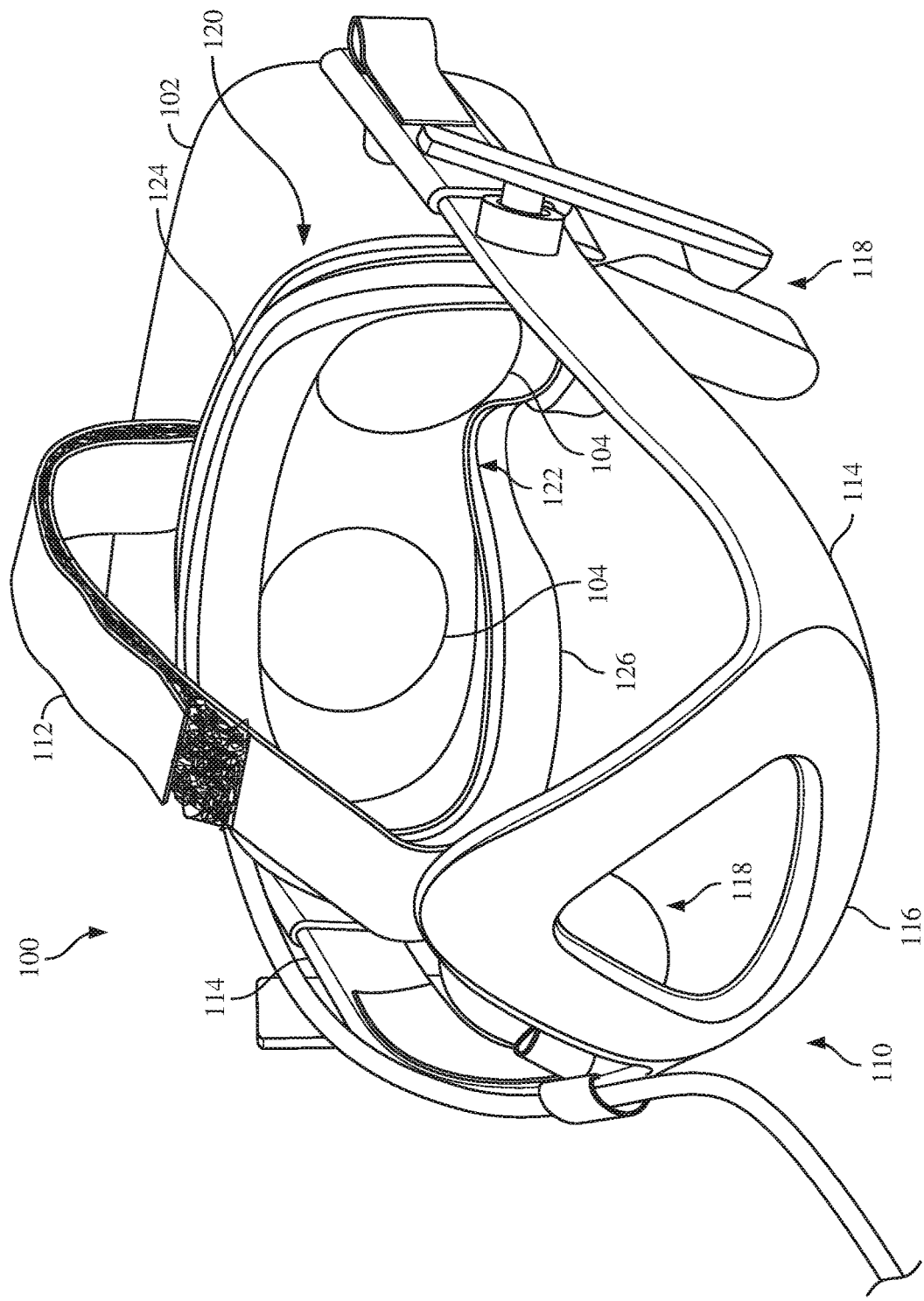
FIG. 1 is a perspective view of an exemplary head-mounted-display system.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure describes various facial-interface cushions, systems, and methods for head-mounted displays. As will be explained in greater detail below, embodiments of the instant disclosure may include facial-interface cushions (i.e., head-mounted-display cushions) that may be attached to mounting surfaces of facial-interface systems for head-mounted displays. In some embodiments, a facial-interface cushion may include a user-side surface dimensioned to abut a facial portion of a user and one or more curved surfaces arcing from the user-side surface toward a display-side surface of the facial-interface cushion. The curved surfaces of the facial-interface cushion may provide a comfortable surface contacting the face of a user wearing a head-mounted display without adding bulk to the facial-interface system. In some embodiments, the facial-interface cushion may include a foam channel extending into the facial-interface cushion from the display-side surface. The foam channel may allow for movement of air and facilitate dissipation of heat in the facial-interface cushion, preventing user discomfort and fogging of head-mounted display lenses and eyeglasses worn by the user.

Embodiments of the instant disclosure may also include various methods for manufacturing facial-interface cushions from foam layers. The methods may utilize mold assemblies including recessed mold members to form the foam layers into shaped foam elements having curved surfaces for contacting user facial regions. The shaped foam elements may be heated to soften the shaped foam elements, allowing the foam elements to assume the molded shapes. The shaped and heated foam elements may then be removed from the mold assemblies and subsequently cooled to form the facial-interface cushions having the curved surfaces. The described methods may also enable manufacturing of facial-interface cushions having a variety of beneficial features, such as curved surface portions and cooling channels. As discussed in greater detail below, these and other disclosed embodiments, whether used alone or in combination, may help optimize the immersiveness, enjoyability, and/or utility of a virtual- or augmented-reality experience.

The following will provide, with reference to FIG. 1, examples of head-mounted-display systems that include facial-interface cushions. In addition, the discussion associated with FIGS. 2-6, 10-13, 18, 20, and 21 will provide examples of methods, systems, and components for manufacturing facial-interface cushions. Finally, the discussion corresponding to FIGS. 7-9, 14-17, and 19 will provide examples of facial-interface cushions.

FIG. 1 is a perspective view of a head-mounted-display system 100 in accordance with various embodiments. In some embodiments, head-mounted-display system 100 may include a head-mounted display 102, a strap system 110, an audio subsystem 118, and a facial-interface system 120. The term "head-mounted display," as used herein, generally refers to any type or form of display device or system that is worn on or about a user's head and displays visual content to a user. Head-mounted displays may display content in any suitable manner, including via a screen (e.g., an LCD or LED screen), a projector, a cathode ray tube, an optical mixer, etc. Head-mounted displays may also display content in one or more of various media formats. For example, a head-mounted display may display video, photos, and/or computer-generated imagery (CGI).

Head-mounted displays may provide diverse and distinctive user experiences. Some head-mounted displays may provide virtual-reality experiences (i.e., they may display computer-generated or pre-recorded content), while other head-mounted displays may provide real-world experiences (i.e., they may display live imagery from the physical world). Head-mounted displays may also provide any mixture of live and virtual content. For example, virtual content may be projected onto the physical world (e.g., via optical or video see-through), which may result in augmented reality or mixed reality experiences.

Head-mounted displays may be configured to be mounted to a user's head in a number of ways. Some head-mounted displays may be incorporated into glasses or visors. Other head-mounted displays may be incorporated into helmets, hats, or other headwear. Examples of head-mounted displays may include OCULUS RIFT, GOOGLE GLASS, VIVE, SAMSUNG GEAR, etc.

In various embodiments, head-mounted display 102 may include lenses 104 positioned to enable the user to view displayed content. Head-mounted display 102 may, for example, include right and left lenses 104 corresponding to the user's right and left eyes. Slightly different content may be displayed by separate display regions of head-mounted display 102 that are viewable by the user through each of right and left lenses 104, respectively, providing a three-dimensional viewing experience to the user.

In some embodiments, strap system 110 may be used for adjustably mounting head-mounted display 102 on the user's head. As shown in FIG. 1, strap system 110 may include an upper strap 112 and lower straps 114 that are coupled to head-mounted display 102 to adjustably conform to the top and/or sides of the user's head when the user is wearing head-mounted-display system 100. In some embodiments, strap system 110 may include a back piece 116 coupled with upper strap 112 and lower straps 114 to rest against the back of the user's head (e.g., around the user's occipital lobe).

In some embodiments, audio subsystem 118 may be integrated with head-mounted display 102 and may provide audio signals to the user's ears. Head-mounted-display system 100 may, for example, have two audio subsystems 118 located on the left and right sides of head-mounted-display system 100 to provide audio signals to the user's left and right ears.

In some embodiments, facial-interface system 120 may be configured to comfortably rest against a region of the user's face, including a region surrounding the user's eyes, when head-mounted-display system 100 is worn by the user. In these embodiments, facial-interface system 120 may include a facial-interface cushion 126 (i.e., a head-mounted-display cushion) that is coupled to a facial-interface mounting member 124. Facial-interface cushion 126 and facial-interface mounting member 124 may surround a viewing region 122 that includes the user's field of vision, allowing the user to look through lenses 104 of head-mounted display 102 without interference from outside light while the user is wearing head-mounted-display system 100. Facial-interface mounting member 124 may be coupled to head-mounted display 102 and/or may be integrally formed with at least a portion of head-mounted display 102. In some embodiments, facial-interface mounting member 124 may be removably coupled to head-mounted display 102 to allow for removal and attachment by a user. Additionally or alternatively, facial-interface mounting member 124 may be secured to and/or integrally formed with a portion of head-mounted display 102 such that facial-interface mounting member 124 is not easily removed by a user.

Figure 2:
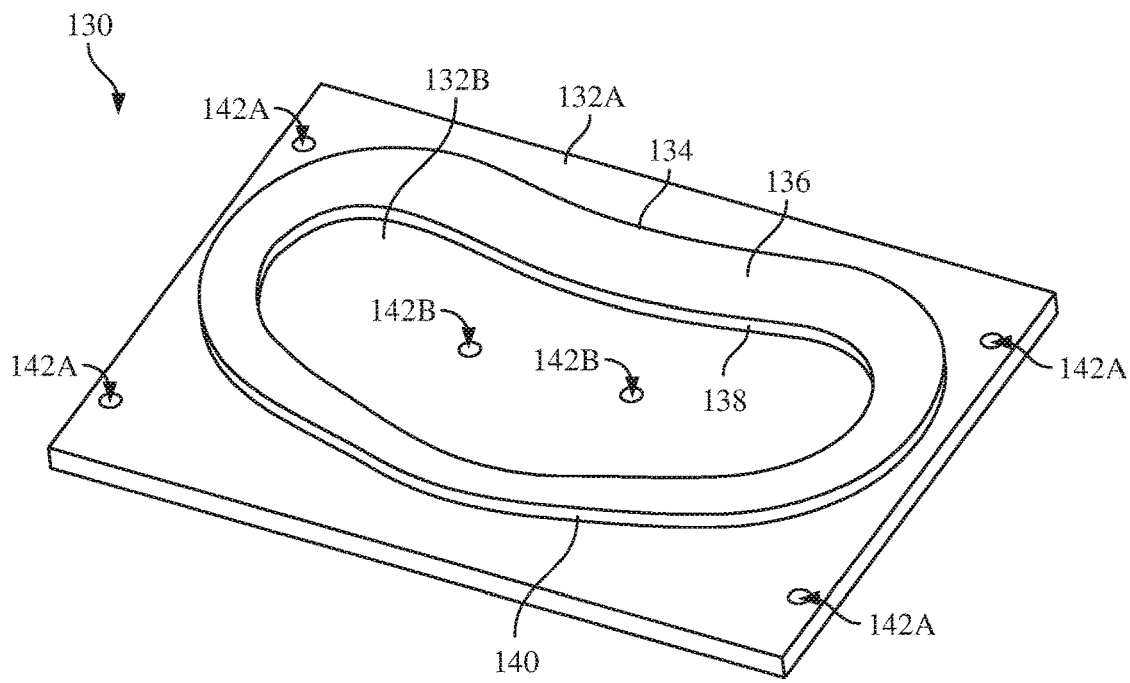
FIG. 2 is a perspective view of an exemplary insertion mold member of a mold assembly for manufacturing a facial-interface cushion.
Figure 3:
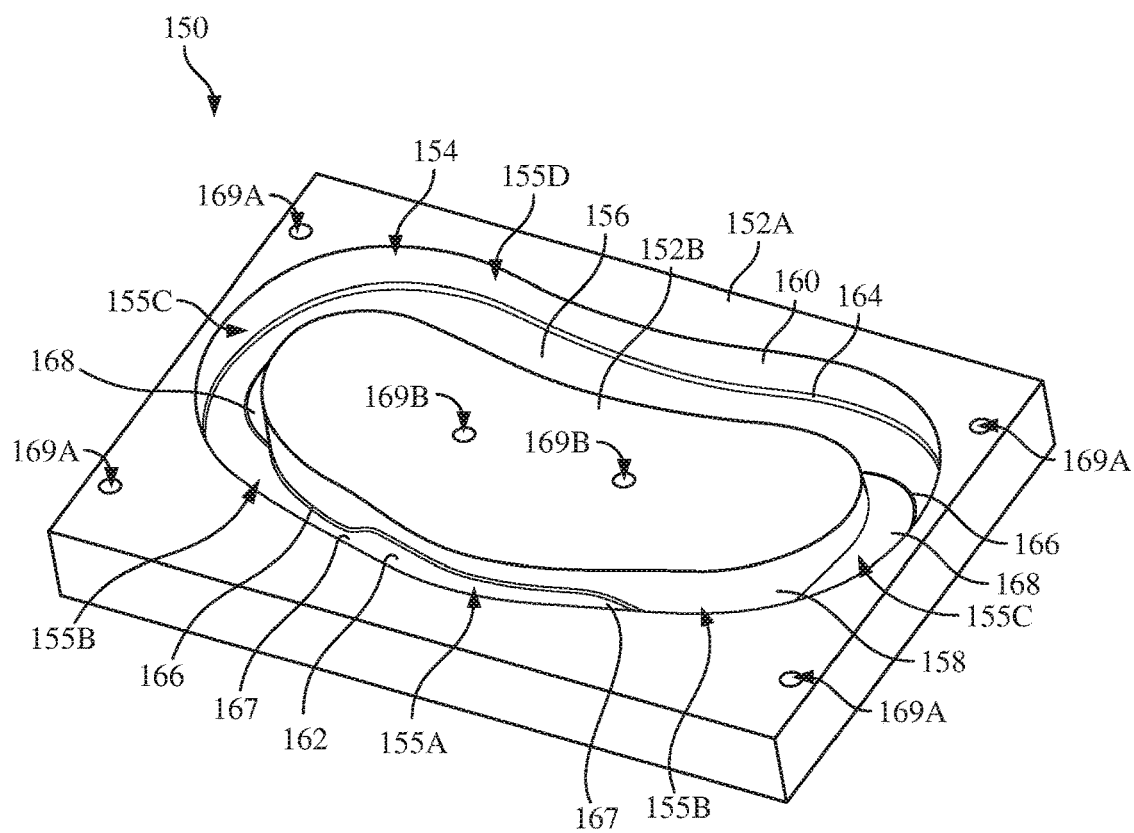
FIG. 3 is a perspective view of an exemplary recessed mold member of a mold assembly for manufacturing a facial-interface cushion.

FIGS. 2 and 3 are perspective views showing exemplary components of a mold assembly for manufacturing a facial-interface cushion 126 according to some embodiments. FIG. 2 illustrates an exemplary insertion mold member 130 and FIG. 3 shows an exemplary recessed mold member 150 that is utilized with insertion mold member 130 to mold and form facial-interface cushion 126 from a foam layer. Insertion mold member 130 and recessed mold member 150 may each include any suitable materials for molding facial-interface cushion 126 in a heated environment, without limitation. For example, insertion mold member 130 and/or recessed mold member 150 may include machined or molded metal (e.g., hardened steel, pre-hardened steel, aluminum, beryllium-copper allow, etc.). In some examples, portions of insertion mold member 130 and/or recessed mold member 150 may be plated with a suitable coating (e.g., nickel, chrome, titanium nitride, etc.) to prevent corrosion and/or wear.

As shown in FIG. 2, insertion mold member 130 may include an outer mold facing surface 132A and an inner mold facing surface 132B configured to face and/or contact corresponding facing surfaces of a recessed mold member 150, which will be discussed in greater detail below in reference to FIG. 3. Outer mold facing surface 132A and inner mold facing surface 132B may each have any suitable surface shape, without limitation. For example, outer mold facing surface 132A and/or inner mold facing surface 132B may be substantially planar surfaces.

Insertion mold member 130 may also include a protruding portion 134 that protrudes from outer mold facing surface 132A and/or inner mold facing surface 132B. Protruding portion 134 may be sized to fit within a mold channel (e.g., mold channel 154 shown in FIG. 3) defined in recessed mold member 150. As shown in FIG. 2, protruding portion 134 may include a protrusion end surface 136, a protrusion inner side surface 138, and a protrusion peripheral side surface 140. Protrusion end surface 136 may have any suitable surface shape, without limitation, including, for example, a substantially planar surface. Protrusion inner side surface 138 may extend between inner mold facing surface 132B and protrusion end surface 136 and protrusion peripheral side surface may extend between outer mold facing surface 132A and protrusion end surface 136. In some examples, protruding portion 134 may extend along an arcuate path. For example, as shown in FIG. 2, protruding portion 134 may follow a looped path, with protrusion inner side surface 138 formed on an inner portion of the looped path surrounding inner mold facing surface 132B and protrusion peripheral side surface 140 formed on a periphery of the looped path surrounded by outer mold facing surface 132A.

In one embodiment, at least one alignment hole for aligning insertion mold member 130 with recessed mold member 150 shown in FIG. 3 may be defined within insertion mold member 130. For example, as illustrated in FIG. 2, a plurality of outer alignment holes 142A may be defined in insertion mold member 130 extending from outer mold facing surface 132A through at least a portion of insertion mold member 130. Additionally or alternatively, a plurality of inner alignment holes 142B may be defined in insertion mold member 130 extending from inner mold facing surface 132B through at least a portion of insertion mold member 130. One or more of outer alignment holes 142A and/or inner alignment holes 142B may, for example, extend through insertion mold member 130 in a thickness direction (e.g., a direction substantially perpendicular to outer mold facing surface 132A and/or inner mold facing surface 132B) from outer mold facing surface 132A and/or inner mold facing surface 132B to a rear surface of insertion mold member 130 opposite outer mold facing surface 132A and/or inner mold facing surface 132B.

Figure 5:
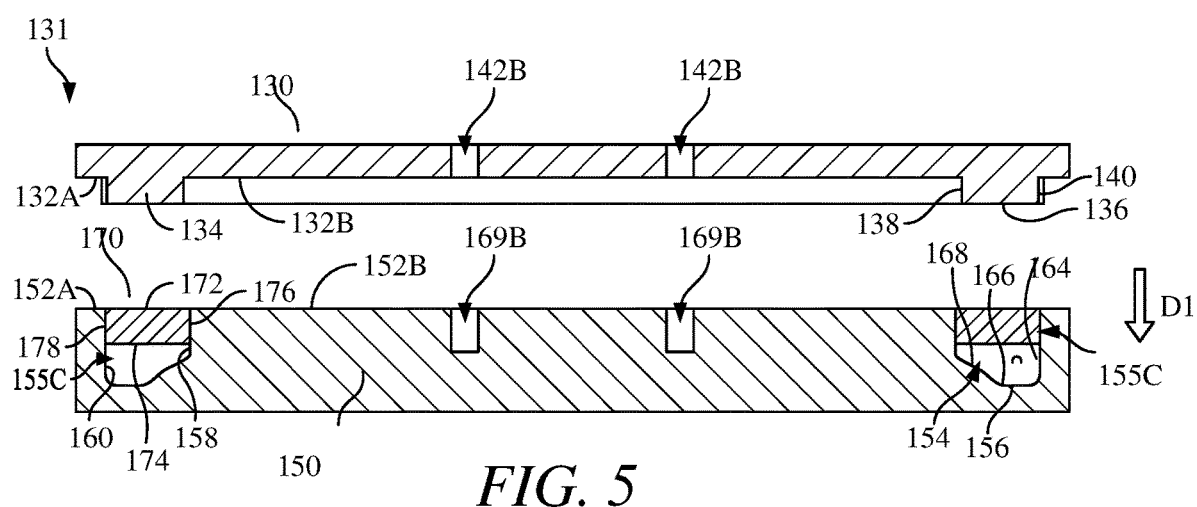
FIG. 5 is a cross-sectional view of a foam layer positioned in an exemplary mold assembly for manufacturing a facial-interface cushion.
Figure 6:
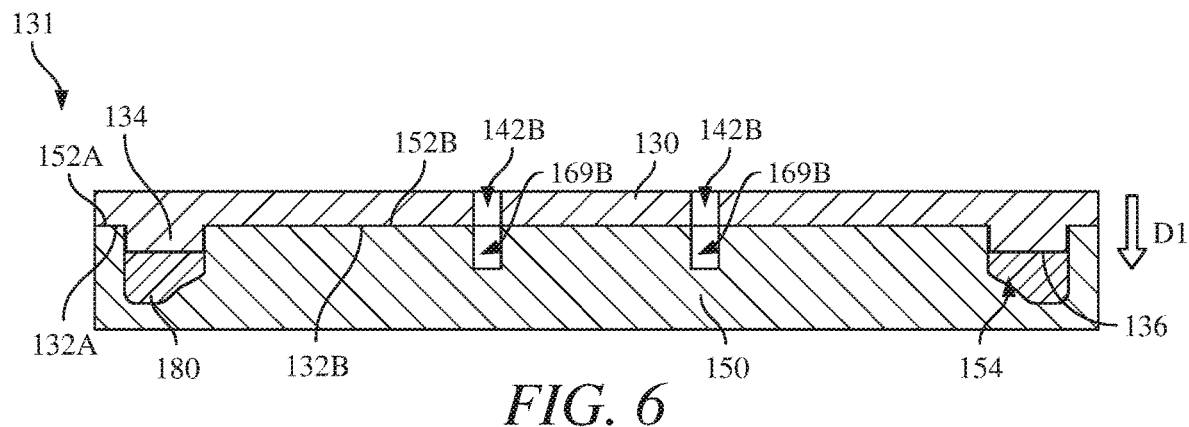
FIG. 6 is a cross-sectional view of a shaped foam element disposed in an exemplary mold assembly for manufacturing a facial-interface cushion.

FIG. 3 illustrates recessed mold member 150, which may include an outer mold facing surface 152A configured to face and/or contact corresponding outer mold facing surface 132A of insertion mold member 130 as part of a mold assembly (see, e.g., mold assembly 131 illustrated in FIGS. 5 and 6). Additionally, recessed mold member 150 may include an inner mold facing surface 152B configured to face and/or contact corresponding inner mold facing surface 132B of insertion mold member 130 as part of the mold assembly. Outer mold facing surface 152A and inner mold facing surface 152B may each have any suitable surface shape, without limitation. For example, outer mold facing surface 152A and/or inner mold facing surface 152B may be substantially planar surfaces.

Recessed mold member 150 may additionally define a mold channel 154 within a portion of recessed mold member 150. Mold channel 154 may extend into recessed mold member 150 from outer mold facing surface 152A and/or inner mold facing surface 152B. In some examples, mold channel 154 may extend along an arcuate path. For example, as shown in FIG. 3, mold channel 154 may follow a looped path corresponding to a looped path followed by protruding portion 134 of insertion mold member 130 such that protruding portion 134 of insertion mold member 130 is at least partially disposed within mold channel 154 of recessed mold member 150 as part of a mold assembly (see, e.g., mold assembly 131 illustrated in FIG. 6).

Figure 4:
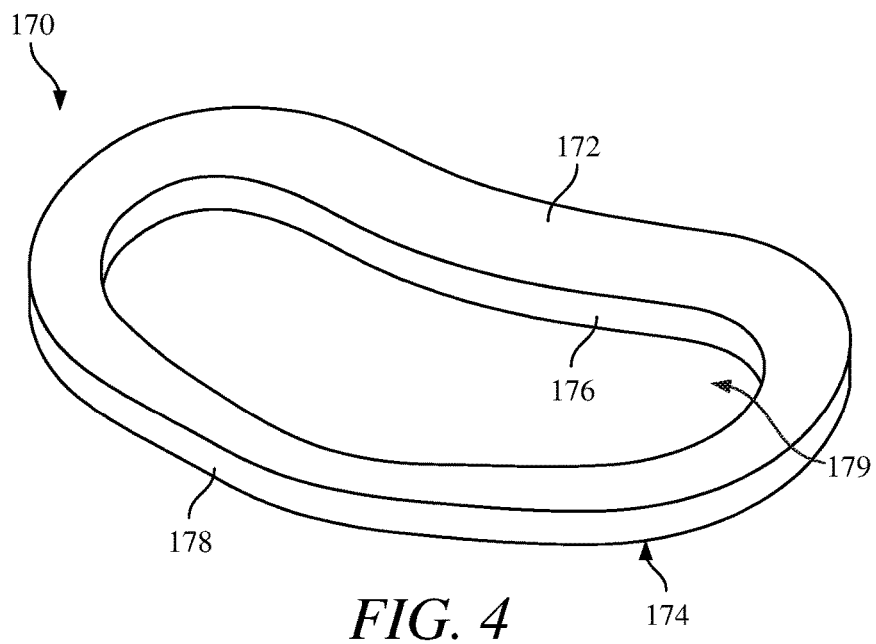
FIG. 4 is a perspective view of an exemplary foam layer for producing a facial-interface cushion for a head-mounted display.

In some embodiments, mold channel 154 may be sized and shaped to hold and form a foam layer (see, e.g., foam layer 170 illustrated in FIG. 4). Mold channel 154 may include various regions corresponding to regions of facial-interface cushion 126 molded within mold channel 154. For example, mold channel 154 may include a nasal region 155A that molds a portion of facial-interface cushion 126 dimensioned to abut and/or contact a nasal region of a user's face, cheek regions 155B that mold portions of facial-interface cushion 126 dimensioned to abut and/or contact cheek regions of a user's face, temple regions 155C that mold portions of facial-interface cushion 126 dimensioned to abut and/or contact temple regions of a user's face, and a forehead region 155D that molds a portion of facial-interface cushion 126 dimensioned to abut and/or contact a forehead region of a user's face.

As illustrated in FIG. 3, mold channel 154 may be defined by a channel bottom surface 156, which includes a surface of recessed mold member 150 disposed to a greatest depth within recessed mold member 150 relative to outer mold facing surface 152A and/or inner mold facing surface 152B. Mold channel 154 may also be defined by a channel inner side surface 158 and a channel peripheral side surface 160. Channel inner side surface 158 may define an inner portion of mold channel 154 following an inner portion of a looped path surrounding inner mold facing surface 152B and channel peripheral side surface 160 may define a peripheral portion of mold channel 154 following a periphery of the looped path surrounded by outer mold facing surface 152A.

In some embodiments, as shown in FIG. 3, mold channel 154 may also be defined by a channel raised surface 162 of recessed mold member 150 that is located at a shallower depth than channel bottom surface 156 relative to outer mold facing surface 152A and/or inner mold facing surface 152B. In some examples, channel raised surface 162 may define a portion of mold channel 154 in nasal region 155A. In this example, one or more portions of recessed mold member 150 may include channel inclined surfaces 167 sloping between ends of channel raised surface 162 and adjacent portions of channel bottom surface 156. In one embodiment, mold channel 154 may also be defined by one or more sloped surfaces extending between channel bottom surface 156 and channel inner side surface 158 and/or channel peripheral side surface 160. For example, as illustrated in FIG. 3, recessed mold member 150 may include channel sloped surfaces 168 extending between portions of channel bottom surface 156 and portions of channel inner side surface 158 and defining portions of temple regions 155C of mold channel 154.

In at least one embodiment, mold channel 154 may be defined by at least one curved surface arcing between channel bottom surface 156 and channel inner side surface 158, channel peripheral side surface 160, and/or channel sloped surface 168. For example, as illustrated in FIG. 3, a channel peripheral curved surface 164 may arc between channel bottom surface 156 and channel peripheral side surface 160. Additionally or alternatively, a channel inner curved surface 166 may arc between channel bottom surface 156 and channel inner side surface 158 and/or channel sloped surface 168. Channel peripheral curved surface 164 and/or channel inner curved surface 166 may extend respectively along peripheral and/or inner portions of channel bottom surface 156 defining cheek regions 155B, temple regions 155C, and/or forehead region 155D of mold channel 154. In some embodiments, channel peripheral curved surface 164 and/or channel inner curved surface 166 may also respectively extend along peripheral and/or inner portions of channel inclined surfaces 167 and/or channel raised surface 162 defining nasal region 155A of mold channel 154. As will be described in greater detail below, channel peripheral curved surface 164 and/or channel inner curved surface 166 may mold corresponding curved surfaces of molded facial-interface cushion 126 that are configured to abut and/or contact facial regions of a user.

In one embodiment, at least one alignment hole for aligning recessed mold member 150 with insertion mold member 130 may be defined within recessed mold member 150. For example, as illustrated in FIG. 3, a plurality of outer alignment holes 169A may be defined in recessed mold member 150 extending from outer mold facing surface 152A through at least a portion of recessed mold member 150. Additionally or alternatively, a plurality of inner alignment holes 169B may be defined in recessed mold member 150 extending from inner mold facing surface 152B through at least a portion of recessed mold member 150. One or more of outer alignment holes 169A and/or inner alignment holes 169B may, for example, extend at least partially through recessed mold member 150 in a thickness direction (e.g., a direction substantially perpendicular to outer mold facing surface 152A and/or inner mold facing surface 152B) from outer mold facing surface 152A and/or inner mold facing surface 152B toward a rear surface of recessed mold member 150 opposite outer mold facing surface 152A and/or inner mold facing surface 152B.

FIG. 4 is a perspective view showing an exemplary foam layer 170 for producing a facial-interface cushion 126 according to some embodiments. Foam layer 170 may include any material that is moldable into facial-interface cushion 126 in a mold assembly (e.g., mold assembly 131 illustrated in FIGS. 5 and 6) when exposed to elevated heat. In some embodiments, foam layer 170 may include a thermoplastic and/or thermosetting polymer material that softens and becomes pliable and/or moldable when heated above a specified temperature (e.g., a softening point) and that solidifies upon cooling. Foam layer 170 may, for example, maintain the shape shown in FIG. 4 at temperatures below the specified temperature. Foam layer 170 may include a resilient foam material that may be compressed and/or deformed when a force is applied, and that may return to its original shape when the force is removed. Upon heating above the specified temperature, intermolecular bonds within the material of foam layer 170 may weaken, allowing the material to take on a new shape. When the material is subsequently cooled, the material may harden and maintain the new shape.

In some embodiments, foam layer 170 may include a thermoplastic and/or thermosetting foam material that includes a foam structure defining numerous pockets having any suitable range of sizes prior to, during, and following molding. Foam layer 170 may, for example, include a polymeric foam material having a suitable degree of elasticity and conformability following molding, enabling molded facial-interface cushion 126 to conform to contours of a facial-interface mounting member 124 (see, e.g., FIG. 1) and to comfortably contact and/or conform to facial regions of a user. Examples of suitable thermoplastic and/or thermosetting polymer materials included in foam layer 170 may include, without limitation, polyurethanes, polyether urethanes, polyester urethanes, polyethylenes, ethyl vinyl acetates, polypropylenes, and/or polyesters. Thermoplastic and/or thermosetting polymer materials in foam layer 170 may also include one or more additives, including, for example, tackifiers, plasticizers, waxes, and/or stabilizers, without limitation. Foam layer 170 may include an open-cell or closed-cell foam. In one example, foam layer 170 may include an open-cell polyurethane foam material.

In at least one embodiment, foam layer 170 may include a reticulated foam material. For example, foam layer 170 may include a reticulated foam material, such as a polyurethane reticulated foam material, having any suitable porosity and density. For example, the reticulated foam material may have a porosity in a range from approximately 10 pores per inch (PPI) to approximately 100 PPI (e.g., less than 10 PPI, approximately 10 PPI to approximately 15 PPI, approximately 15 PPI to approximately 20 PPI, approximately 20 PPI to approximately 25 PPI, approximately 25 PPI to approximately 30 PPI, approximately 30 PPI to approximately 35 PPI, approximately 35 PPI to approximately 40 PPI, approximately 40 PPI to approximately 45 PPI, approximately 45 PPI to approximately 50 PPI, approximately 50 PPI to approximately 55 PPI, approximately 55 PPI to approximately 60 PPI, approximately 60 PPI to approximately 65 PPI, approximately 65 PPI to approximately 70 PPI, approximately 70 PPI to approximately 75 PPI, approximately 75 PPI to approximately 80 PPI, approximately 80 PPI to approximately 85 PPI, approximately 85 PPI to approximately 90 PPI, approximately 90 PPI to approximately 95 PPI, approximately 95 PPI to approximately 100 PPI, and/or more than 100 PPI). The reticulated foam material may be formed from a foam material through any suitable reticulation technique, including, for example, a thermal technique (e.g., zapping) and/or a chemical technique (e.g., quenching). Advantageously, foam layer 170 including the reticulated foam material may be molded into a facial-interface cushion that is more breathable, softer, and more aesthetically pleasing than facial-interface cushions formed with conventional non-reticulated foam materials. Additionally, in comparison to conventional facial-interface cushions, a facial-interface cushion formed from the reticulated foam material may have more facial friction when contacting a user's face, enabling head-mounted display 102 shown in FIG. 1 to be securely fitted to a user's face with a lower strap tightness from strap system 110, thereby increasing user comfort. Additionally, the reticulated foam material may be more easily cleaned by, for example, rinsing with water in comparison to conventional facial interface cushions.

The specified temperature, above which a thermoplastic and/or thermosetting material softens and becomes pliable and/or moldable, may include any suitable temperature above a standard normal temperature of 20° C. (68° F.), without limitation. For example, a specified temperature (e.g., softening point) suitable for molding for one or more of the disclosed thermoplastic and/or thermosetting foam materials may be in a range from approximately 50° C. to approximately 500° C. (e.g., approximately 50° C. to approximately 60° C., approximately 60° C. to approximately 70° C., approximately 70° C. to approximately 80° C., approximately 80° C. to approximately 90° C., approximately 90° C. to approximately 100° C., approximately 100° C. to approximately 110° C., approximately 110° C. to approximately 120° C., approximately 120° C. to approximately 130° C., approximately 130° C. to approximately 140° C., approximately 140° C. to approximately 150° C., approximately 150° C. to approximately 160° C., approximately 160° C. to approximately 170° C., approximately 170° C. to approximately 180° C., approximately 190° C. to approximately 200° C., approximately 200° C. to approximately 210° C., approximately 210° C. to approximately 220° C., approximately 220° C. to approximately 230° C., approximately 230° C. to approximately 240° C., approximately 240° C. to approximately 250° C., approximately 250° C. to approximately 260° C., approximately 260° C. to approximately 270° C., approximately 270° C. to approximately 280° C., approximately 280° C. to approximately 290° C., approximately 290° C. to approximately 300° C., approximately 300° C. to approximately 350° C., approximately 350° C. to approximately 400° C., approximately 400° C. to approximately 450° C., and/or approximately 450° C. to approximately 500° C.). In some embodiments, a thermoplastic and/or thermosetting foam material of foam layer 170 may be heated at and/or to a temperature within a predetermined range of temperatures during molding. Foam layer 170 may, for example, be heated above a specified temperature allowing for softening of foam layer 170 and below a temperature at which foam layer 170 may begin to melt and/or otherwise lose its structural integrity. For example, a thermoplastic open-cell polyurethane foam may be heated at a temperature in a range of between approximately 150° C. and approximately 190° C. during molding.

In at least one embodiment, foam layer 170 may be cut from a larger layer and/or otherwise formed prior to molding into facial-interface cushion 126. For example, foam layer 170 may be cut (e.g., die cut) from a larger foam sheet. In one embodiment, foam layer 170 may additionally or alternatively be cut following molding to trim away selected portions. As shown in FIG. 4, foam layer 170 may include a layer upper surface 172 and a layer lower surface 174 opposite layer upper surface 172. Foam layer 170 may also include a layer inner surface 176 and a layer peripheral surface 178 extending between layer upper surface 172 and layer lower surface 174. Layer inner surface 176 may define an opening 179 extending through foam layer 170 in a thickness direction. Foam layer 170 may be any suitable size, shape, and/or thickness. In some examples, foam layer 170 may have a substantially constant thickness over its length and width.

According to at least one embodiment, foam layer 170 may be dimensioned to fit within mold channel 154 of recessed mold member 150 shown in FIG. 3. For example, foam layer 170 may have a shape following an arcuate and/or looped path that generally or substantially matches a path followed by mold channel 154, as shown in FIG. 3. In some examples, foam layer 170 may be shaped to fit within at least a portion of mold channel 154 adjacent to outer mold facing surface 152A and/or inner mold facing surface 152B. In one example, foam layer 170 may have a width that is larger than a portion of mold channel 154 adjacent to outer mold facing surface 152A and/or inner mold facing surface 152B of recessed mold member 150 such that at least a portion of foam layer 170 rests on outer mold facing surface 152A and/or inner mold facing surface 152B when foam layer is loaded onto recessed mold member 150.

FIGS. 5 and 6 are cross-sectional views illustrating a mold assembly 131 for molding foam layer 170 into facial-interface cushion 126 in accordance with some embodiments. As shown in FIG. 5, foam layer 170 may be loaded between insertion mold member 130 and recessed mold member 150. For example, as shown in FIG. 5, foam layer 170 may be placed within at least a portion of mold channel 154 defined in recessed mold member 150, such as a portion of mold channel 154 adjacent to outer mold facing surface 152A and/or inner mold facing surface 152B. In some examples, layer lower surface 174 of foam layer 170 may face toward channel bottom surface 156 of recessed mold member 150 and layer upper surface 172 of foam layer 170 may face away from channel bottom surface 156. Layer inner surface 176 of foam layer 170 may face channel inner side surface 158 of recessed mold member 150 and layer peripheral surface 178 of foam layer 170 may face channel peripheral side surface 160 of recessed mold member 150. In some embodiments, foam layer 170 may not be disposed in mold channel 154 in the manner illustrated in FIG. 5. For example, at least a portion of foam layer 170 may protrude from mold channel 154 and/or may be disposed on outer mold facing surface 152A and/or inner mold facing surface 152B. Additionally or alternatively, one or more portions of foam layer 170 may be angled, at least partially folded, and/or otherwise deformed within mold channel 154.

According to some embodiments, insertion mold member 130 and/or recessed mold member 150 may be heated prior to loading foam layer 170 into mold channel 154 and/or between insertion mold member 130 and recessed mold member 150. For example, insertion mold member 130 and/or recessed mold member 150 may be pre-heated to an elevated temperature at or above a specified temperature (e.g., a softening point) for softening foam layer 170. In at least one embodiment, insertion mold member 130 and/or recessed mold member 150 may be maintained at the elevated temperature during molding. In some examples, insertion mold member 130 and/or recessed mold member 150 may be pre-heated to the elevated temperature but may not be further heated during molding. In some embodiments, foam layer 170 may be heated separately from insertion mold member 130 and/or recessed mold member 150 prior to loading foam layer 170 into mold assembly 131. For example, foam layer 170 may be heated to an elevated temperature at or above the specified temperature to soften foam layer 170, after which foam layer 170 may be loaded into mold assembly 131 with or without further heating from insertion mold member 130 and/or recessed mold member 150. In one embodiment, mold assembly 131 may be disposed within a heated vessel to heat mold assembly 131 and foam layer 170 during molding.

Once foam layer 170 is loaded into mold assembly 131, insertion mold member 130 may be moved toward recessed mold member 150 and foam layer 170 in direction D1 shown in FIGS. 5 and 6. Although not illustrated in FIGS. 5 and 6, guides, such as alignment pins, may be disposed within outer alignment holes 142A and/or inner alignment holes 142B defined in insertion mold member 130 and within corresponding outer alignment holes 169A and/or inner alignment holes 169B defined in recessed mold member 150 to guide and/or hold insertion mold member 130 in proper alignment with recessed mold member 150.

As illustrated in FIG. 6, insertion mold member 130 may be moved in direction D1 until insertion mold member 130 abuts and/or contacts recessed mold member 150. For example, as shown in FIG. 6, outer mold facing surface 132A and inner mold facing surface 132B of insertion mold member 130 may respectively be disposed adjacent to and/or abutting outer mold facing surface 152A and inner mold facing surface 152B of recessed mold member 150. In this example, protruding portion 134 of insertion mold member 130 may be disposed within a portion of mold channel 154 such that protrusion inner side surface 138 and protrusion peripheral side surface 140 are respectively disposed adjacent to and/or abutting channel inner side surface 158 and channel peripheral side surface 160 of recessed mold member 150. In some embodiments, protruding portion 134 of insertion mold member 130 may be dimensioned so that a sufficient amount of space exists between protrusion inner side surface 138 and channel inner side surface 158 and/or between protrusion peripheral side surface 140 and channel peripheral side surface 160 to allow for gasses, such as air, to be evacuated from mold channel 154 as foam layer 170 is pushed into mold channel 154 by protruding portion 134 of insertion mold member 130. In some embodiments, holes may be defined in at least a portion of recessed mold member 150 (e.g., a portion adjacent to mold channel 154) and/or in at least a portion of insertion mold member 130 (e.g., within protruding portion 134) to allow for evacuation of gasses within mold channel 154.

As protruding portion 134 of insertion mold member 130 is inserted into mold channel 154 defined in recessed mold member 150, protrusion end surface 136 of protruding portion 134 may force foam layer 170 into mold channel 154 toward channel bottom surface 156. As foam layer 170 is forced into mold channel 154 by protruding portion 134, foam layer 170 may contact and conform to various surfaces of recessed mold member 150 defining mold channel 154, forming a shaped foam element 180. As illustrated, for example, in FIG. 6, shaped foam element 180 may contact at least a portion of channel bottom surface 156, channel inner side surface 158, channel peripheral side surface 160, channel peripheral curved surface 164, channel inner curved surface 166, and/or channel sloped surface 168. Additionally, shaped foam element 180 may contact at least a portion of channel raised surface 162 and/or channel inclined surfaces 167 illustrated in FIG. 3. Shaped foam element 180, which is heated to soften the foam material, may conform to and assume a shape corresponding to the contacted surfaces of recessed mold member 150 and insertion mold member 130 contacting shaped foam element 180.

Shaped foam element 180 may be held between insertion mold member 130 and recessed mold member 150 for an amount of time sufficient to enable shaped foam element 180 to be fully molded to the contacted surfaces of recessed mold member 150 and insertion mold member 130, forming facial-interface cushion 126. For example, shaped foam element 180 may be held between insertion mold member 130 and recessed mold member 150, as shown in FIG. 6, for a time period of from approximately 10 sec to approximately 10 min or more (e.g., approximately 10 sec to approximately 20 sec, approximately 20 sec to approximately 30 sec, approximately 30 sec to approximately 40 sec, approximately 40 sec to approximately 50 sec, approximately 50 sec to approximately 60 sec, approximately 60 sec to approximately 70 sec, approximately 70 sec to approximately 80 sec, approximately 80 sec to approximately 90 sec, approximately 90 sec to approximately 100 sec, approximately 100 sec to approximately 110 sec, approximately 110 sec to approximately 120 sec, approximately 2 min to approximately 2.5 min, approximately 2.5 min to approximately 3 min, approximately 3 min to approximately 3.5 min, approximately 3.5 min to approximately 4 min, approximately 4 min to approximately 4.5 min, approximately 4.5 min to approximately 5 min, approximately 5 min to approximately 6 min, approximately 6 min to approximately 7 min, approximately 7 min to approximately 8 min, approximately 8 min to approximately 9 min, approximately 9 min to approximately 10 min, etc.). In some embodiments, shaped foam element 180 may be heated and molded in mold assembly 131 for a time period within a predetermined range of time periods. For example, shaped foam element 180 may include a thermoplastic open-cell polyurethane foam that may be heated and molded for a time period in a range of between approximately 30 sec and approximately 2 min.

In some embodiments, shaped foam element 180 may be subjected to increased pressure during heating and molding. For example, shaped foam element 180 may be subjected to a pressure within a predetermined range of pressures above a standard normal pressure of 1 atm (14.696 psi, 101.325 kPa). For example, one or more of the disclosed thermoplastic and/or thermosetting foam materials may subjected, during heating, to an elevated pressure in a range from approximately 20 PSI to approximately 200 PSI (e.g., approximately 20 PSI to approximately 30 PSI, approximately 30 PSI to approximately 40 PSI, approximately 40 PSI to approximately 50 PSI, approximately 50 PSI to approximately 60 PSI, approximately 60 PSI to approximately 70 PSI, approximately 70 PSI to approximately 80 PSI, approximately 80 PSI to approximately 90 PSI, approximately 90 PSI to approximately 100 PSI, approximately 100 PSI to approximately 150 PSI, and/or approximately 150 PSI to approximately 200 PSI).

After shaped foam element 180 has been held within mold assembly 131 for a suitable period of time to form facial-interface cushion 126, insertion mold member 130 may be separated from recessed mold member 150 and molded facial-interface cushion 126 may be removed from mold assembly 131. According to some embodiments, facial-interface cushion 126 may be removed from mold assembly 131 and allowed to cool outside of mold assembly 131. For example, facial-interface cushion 126 may be removed from mold channel 154 defined in recessed mold member 150 and cooled to a temperature below the specified temperature (e.g., softening point) to allow facial-interface cushion to solidify and maintain the molded shape. Additionally or alternatively, facial-interface cushion 126 may be at least partially cooled within recessed mold member 150 prior to removing facial-interface cushion 126 from mold assembly 131.

Figure 7:
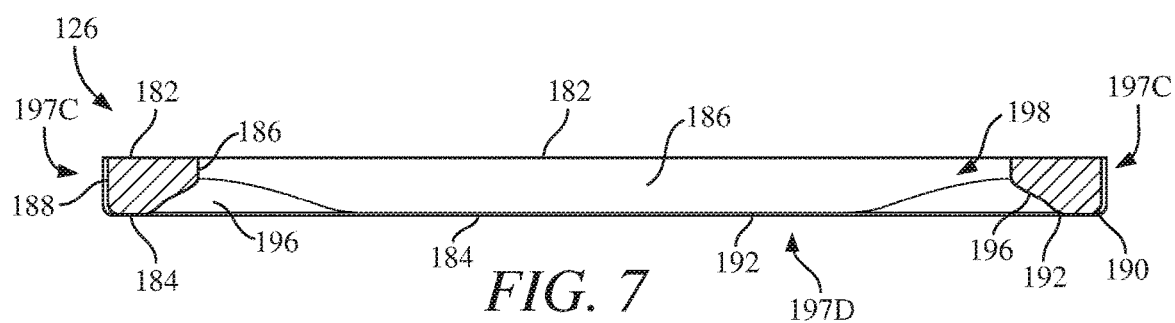
FIG. 7 is a cross-sectional view of an exemplary facial-interface cushion for a head-mounted display.
Figure 8:
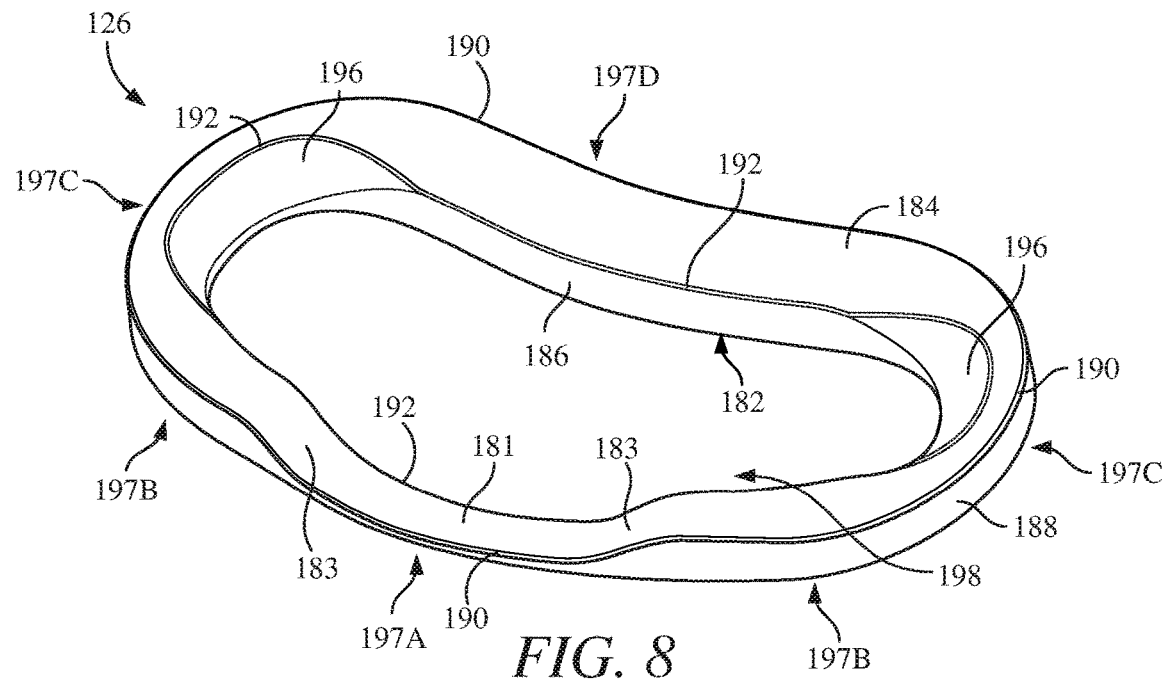
FIG. 8 is a perspective view of an exemplary facial-interface cushion for a head-mounted display.
Figure 9:
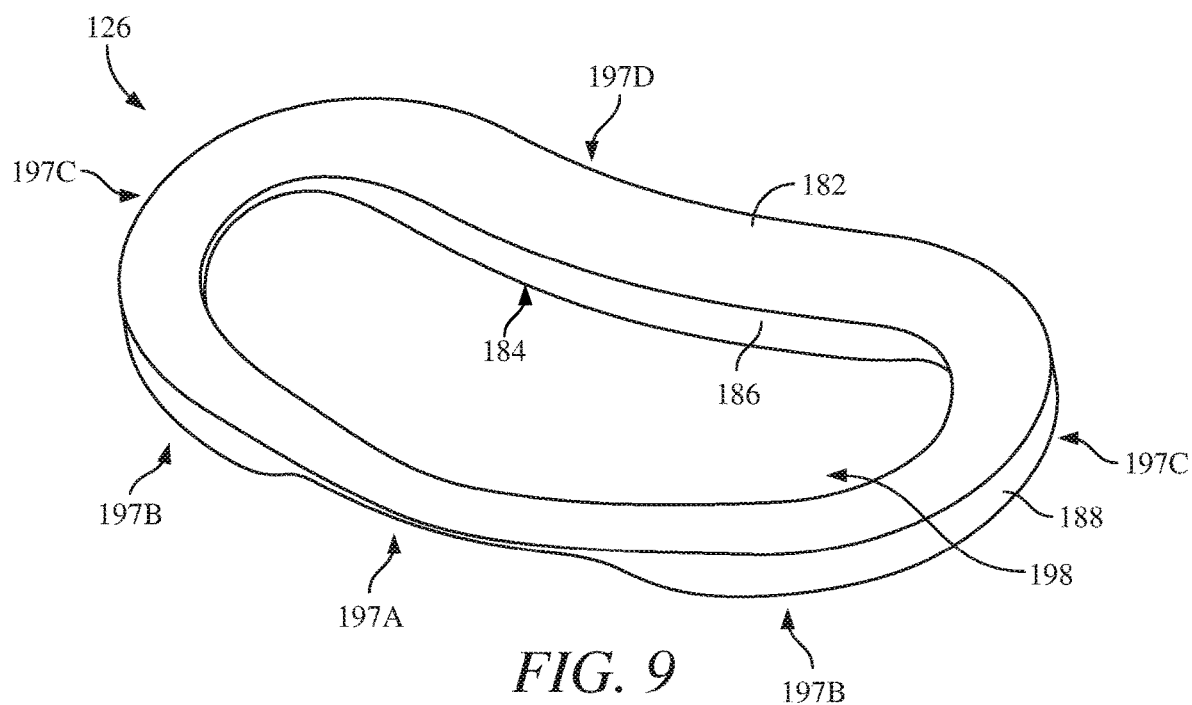
FIG. 9 is a perspective view of an exemplary facial-interface cushion for a head-mounted display.

FIGS. 7-9 show a facial-interface cushion 126 molded by mold assembly 131 according to some embodiments. While the features shown in FIGS. 7-9 are illustrated in relation to facial-interface cushion 126, corresponding features may be present on shaped foam element 180 disposed within mold assembly 131 as shown in FIG. 6.

Facial-interface cushion 126 may include various regions dimensioned to abut and/or conform to selected portions of a user's face when head-mounted-display system 100 shown in FIG. 1 is worn by the user. For example, as shown in FIGS. 7-9, facial-interface cushion 126 may include a cushion nasal region 197A corresponding to a nasal region of the user's face, cushion cheek regions 197B corresponding to cheek regions of the user's face, cushion temple regions 197C corresponding to temple regions of the user's face, and a cushion forehead region 197D corresponding to a forehead region of the user's face. In some embodiments, a portion of facial-interface cushion 126 in cushion nasal region 197A may be thinner than other portions of facial-interface cushion 126.

Facial-interface cushion 126 may include a cushion display-side surface 182 that is dimensioned to abut a mounting surface of facial-interface mounting member 124 shown in FIG. 1. Cushion display-side surface 182 may be formed by protrusion end surface 136 of protruding portion 134 of insertion mold member 130 during molding and may have any suitable shape, size, and configuration. In some embodiments, cushion display-side surface 182 may be a generally flat and/or planar surface prior to mounting facial-interface cushion 126 to facial-interface mounting member 124. In at least one embodiment, as will be described in greater detail below (see, e.g., FIG. 19), one or more recesses, such as a foam channel, may be defined in facial-interface cushion 126 extending from cushion display-side surface 182. Cushion display-side surface 182 may be coupled to facial-interface mounting member 124 in any suitable manner. For example, cushion-display side surface 182 may be bonded, mechanically attached, and/or magnetically attached to a corresponding portion, such as a mounting surface, of facial-interface mounting member 124.

Facial-interface cushion 126 may also include a cushion user-side surface 184 dimensioned to abut a facial portion of a user when head-mounted-display system 100 is worn by the user. For example, cushion user-side surface 184 may be configured to contact and/or conform to at least a portion of the user's nasal, cheek, temple, and/or forehead facial regions. Cushion user-side surface 184 may be formed by channel bottom surface 156 of recessed mold member 150 during molding and may have any suitable shape, size, and configuration. In some embodiments, cushion user-side surface 184 may be a generally flat and/or planar surface prior to mounting facial-interface cushion 126 to facial-interface mounting member 124. Cushion user-side surface 184 may also include any other suitable surface shape, such as a generally arcuate surface and/or otherwise non-planar surface, without limitation.

According to some embodiments, facial-interface cushion 126 may include a cushion inner side surface 186 and a cushion peripheral side surface 188 extending from cushion display-side surface 182 and/or extending between cushion display-side surface 182 and cushion user-side surface 184 in a thickness direction of facial-interface cushion 126. Cushion inner side surface 186 and cushion peripheral side surface 188 may be respectively formed by channel inner side surface 158 and channel peripheral side surface 160 of recessed mold member 150 during molding and may have any suitable shape, size, and configuration. In some embodiments, cushion inner side surface 186 and/or a cushion peripheral side surface 188 may extend in a direction substantially perpendicular to at least a portion of cushion display-side surface 182 and/or cushion user-side surface 184. Additionally or alternatively, cushion inner side surface 186 and/or a cushion peripheral side surface 188 may extend in any other suitable direction, without limitation. As shown in FIGS. 8 and 9, cushion inner side surface 186 may define a viewing opening 198 extending through facial-interface cushion 126. Viewing opening 198 may correspond to, for example, viewing region 122 illustrated in FIG. 1. Viewing opening 198 may be sized to surround the eyes and adjacent portions of a user's face so as to not interfere with the user's view of lenses 104 shown in FIG. 1.

In at least one embodiment, facial-interface cushion 126 may include at least one cushion sloped surface 196 extending between at least a portion of cushion user-side surface 184 and/or cushion inner side surface 186 and at least a portion of cushion inner side surface 186 and/or cushion display-side surface 182. For example, as shown in FIGS. 7 and 8, facial-interface cushion 126 may include a cushion sloped surface 196 in each of cushion temple regions 197C. In some embodiments, cushion sloped surfaces 196 may slope away from temple, cheek, and/or forehead regions of a user's face when facial-interface cushion 126 is positioned against the user's face while the user is wearing head-mounted-display system 100. As such, cushion sloped surfaces 196 may each define a gap between portions of the user's face and facial-interface cushion 126, accommodating, for example, accessories, such as eyeglasses worn by the user. Additionally, cushion sloped surfaces 196 may decrease an overall surface area of facial-interface cushion 126 contacting the user's face, thereby decreasing an amount of heat built up between the user's face and facial-interface cushion 126. Additionally, because an overall width of facial-interface cushion 126 is not decreased in regions overlapping cushion sloped surfaces 196 (e.g., in cushion temple regions 197C), the structural integrity of facial-interface cushion 126 be maintained in these regions. Additionally, sloped surfaces 196 may be formed on facial-interface cushion 126 without sacrificing an area of cushion display-side surface 182 overlapping cushion sloped surfaces 196, thereby maintaining a substantial surface area available for attaching (e.g., bonding) and/or otherwise securing cushion display-side surface 182 to facial-interface mounting member 124 shown in FIG. 1.

According to at least one embodiment, facial-interface cushion 126 may include a cushion recessed surface 181 in cushion nasal region 197A. Cushion recessed surface 181 may be formed by channel raised surface 162 of recessed mold member 150 during molding and may have any suitable shape, size, and configuration. A portion of facial-interface cushion 126 between cushion recessed surface 181 and cushion display-side surface 182 may be thinner than other portions of facial-interface cushion 126 between cushion user-side surface 184 and cushion display-side surface 182. Because facial-interface cushion 126 is thinner in cushion nasal region 197A at cushion recessed surface 181, cushion nasal region 197A may be readily bent and conformed to a mounting surface of facial-interface mounting member 124 configured to surround a portion of the user's nasal region, as shown in FIG. 1. In order to surround the nasal region of the user's face, cushion nasal region 197A and corresponding regions of facial-interface mounting member 124 may have more pronounced surface variations in facial-interface system 120 than other portions of facial-interface cushion 126 and mounting member 124. Additionally, the thinner cushion nasal region 197A of facial-interface cushion may reduce the profile of facial-interface cushion 126, and may likewise reduce the profile of facial-interface system 120, adjacent to the user's nasal region, allowing facial-interface system 120 to be formed with a smaller overall footprint.

Facial-interface cushion 126 may also include cushion inclined surfaces 183 sloping from cushion recessed surface 181 to adjacent portions of cushion user-side surface 184. Cushion inclined surfaces 183 may be formed by channel inclined surfaces 167 of recessed mold member 150 during molding. In some embodiments, portions of cushion inner side surface 186 and cushion peripheral side surface 188 may extend between cushion display-side surface 182 and one or more of cushion sloped surfaces 196, cushion recessed surface 181, and/or cushion inclined surfaces 183 in a thickness direction of facial-interface cushion 126, as illustrated in FIGS. 6 and 7. In some embodiments, facial-interface cushion 126 may include one or more additional or alternative surfaces sloping between at least a portion of cushion user-side surface 184 and at least one of cushion inner side surface 186 and/or cushion peripheral side surface 188. Additionally or alternatively, facial-interface cushion 126 may include one or more surfaces sloping between at least a portion of cushion display-side surface 182 and at least one of cushion inner side surface 186 and/or cushion peripheral side surface 188.

According to some embodiments, facial-interface cushion 126 may include a cushion peripheral curved surface 190 and/or a cushion inner curved surface 192, each arcing from at least a portion of cushion user-side surface 184 toward cushion display-side surface 182. For example, cushion peripheral curved surface 190 may arc between at least a peripheral side of cushion user-side surface 184 and at least a portion of cushion peripheral side surface 188, as shown in FIGS. 7 and 8. In at least one example, cushion peripheral curved surface 190 may additionally or alternatively arc between at least a peripheral side portion of cushion recessed surface 181 and/or cushion inclined surfaces 183 and at least a portion of cushion peripheral side surface 188. In at least one embodiment, as shown in FIG. 8, cushion peripheral curved surface 190 may be formed around a substantial or entire peripheral portion of facial-interface cushion 126, including peripheral portions of facial-interface cushion 126 in cushion nasal region 197A, cushion cheek regions 197B, cushion temple regions 197C, and cushion forehead region 197D.

Cushion inner curved surface 192 may arc between at least an inner side of cushion user-side surface 184 surrounding viewing opening 198 and at least a portion of cushion inner side surface 186, as shown in FIGS. 7 and 8. In at least one example, cushion inner curved surface 192 may additionally or alternatively arc between at least an inner side portion of cushion recessed surface 181 and/or cushion inclined surfaces 183 surrounding viewing opening 198 and at least a portion of cushion inner side surface 186. Additionally or alternatively, cushion inner curved surface 192 may arc between at least an inner side portion of cushion user-side surface 184 and one or more portions of cushion sloped surfaces 196. In at least one embodiment, as shown in FIG. 8, cushion inner curved surface 192 may be formed around a substantial or entire inner portion of facial-interface cushion 126 surrounding viewing opening 198, including inner portions of facial-interface cushion 126 in cushion nasal region 197A, cushion cheek regions 197B, cushion temple regions 197C, and cushion forehead region 197D. Cushion inner curved surface 192 may define a portion of viewing opening 198. In some embodiments, at least a portion of cushion peripheral curved surface 190 and/or cushion inner curved surface 192 may arc between at least a portion of cushion user-side surface 184, cushion recessed surface 181, and/or cushion inclined surface 183 and at least a portion of cushion display-side surface 182.

Cushion peripheral curved surface 190 and/or cushion inner curved surface 192 may contact portions of a user's face at inner and peripheral regions of cushion user-side surface 184, cushion recessed surface 181, and/or cushion inclined surface 183 when head-mounted-display system 100 is worn by the user. Advantageously, cushion peripheral curved surface 190 and/or cushion inner curved surface 192 may comfortably contact nasal, cheek, temple, and/or forehead regions of the user's face without adding bulk to facial-interface system 120. For example, in contrast to conventional facial-interface cushions having angular edges at peripheral and inner regions of the cushions, which may increase and concentrate pressure at corresponding user facial regions resulting in user discomfort and leaving residual marks and/or indentations on users' skin, cushion peripheral curved surface 190 and/or cushion inner curved surface 192 of facial-interface cushion 126 may better distribute pressure at regions contacting a user's face. Accordingly, cushion peripheral curved surface 190 and/or cushion inner curved surface 192 may contact the user's face in a more comfortable manner that reduces discomfort and prevents the formation of residual marks and/or indentations on the user's skin.

Figure 10:
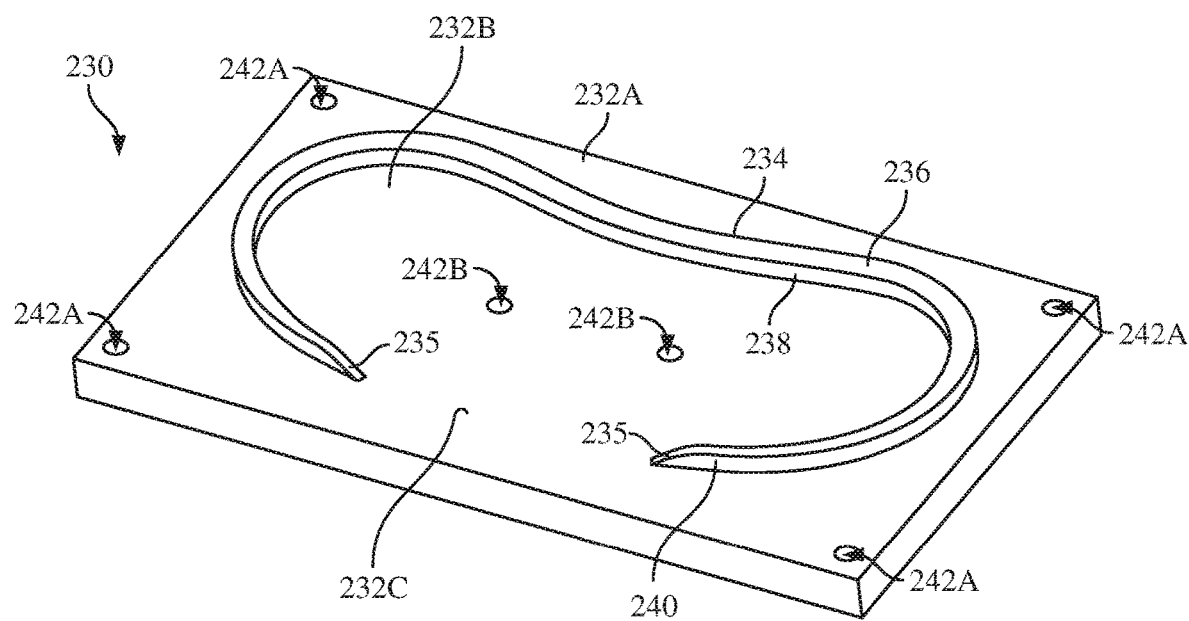
FIG. 10 is a perspective view of an exemplary insertion mold member of a mold assembly for manufacturing a facial-interface cushion.
Figure 11:
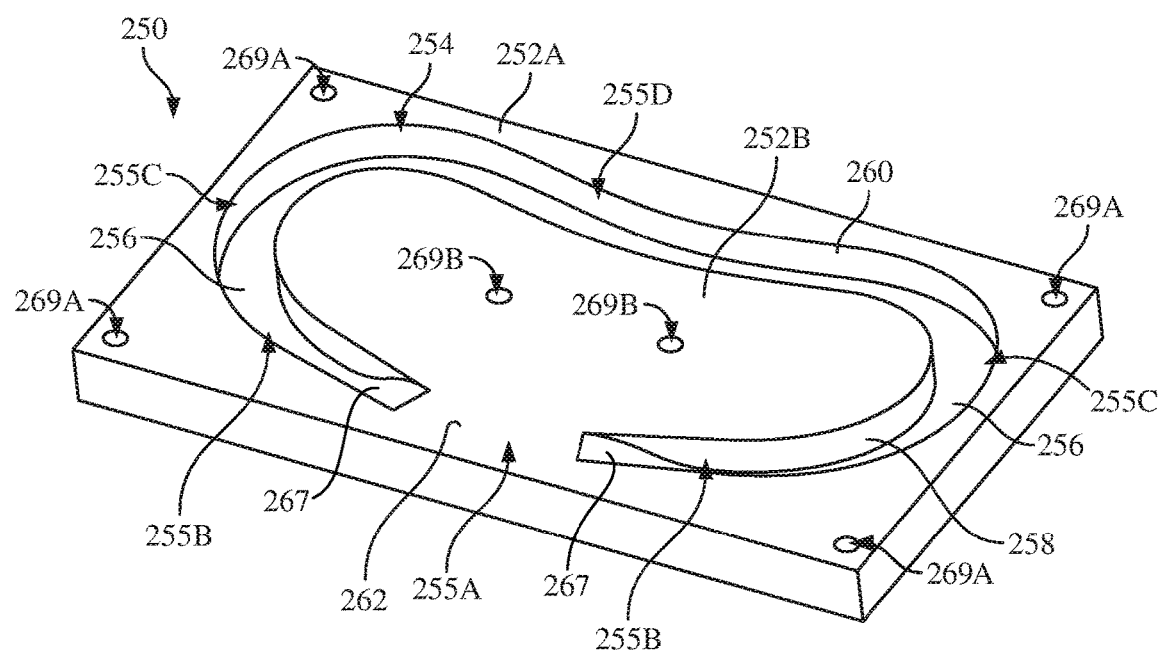
FIG. 11 is a perspective view of an exemplary recessed mold member of a mold assembly for manufacturing a facial-interface cushion.

FIGS. 10 and 11 are perspective views showing exemplary components of a mold assembly (e.g., mold assembly 231 shown in FIGS. 12 and 13) for manufacturing a facial-interface cushion (e.g., facial-interface cushion 226 shown in FIGS. 14 and 15) according to some embodiments. FIG. 10 illustrates an exemplary insertion mold member 230 and FIG. 11 shows an exemplary recessed mold member 250 that is utilized with insertion mold member 230 to mold and form a facial-interface cushion from a foam layer (e.g., foam layer 170 shown in FIG. 4). Insertion mold member 230 and recessed mold member 250 may each include any suitable materials for molding a facial-interface cushion in a heated environment, including materials described above in relation to insertion mold member 130 and recessed mold member 150, without limitation.

As shown in FIG. 10, insertion mold member 230 may include an outer mold facing surface 232A and an inner mold facing surface 232B configured to face and/or contact corresponding facing surfaces of a recessed mold member 250. Outer mold facing surface 232A and inner mold facing surface 232B may each have any suitable surface shape, without limitation. For example, outer mold facing surface 232A and/or inner mold facing surface 232B may be substantially planar surfaces. In some examples, insertion mold member 230 may also include an intermediate mold facing surface 232C extending between a portion of outer mold facing surface 232A and an inner mold facing surface 232B. For example, intermediate mold facing surface 232C may be located in a region of insertion mold member 230 configured to mold a nasal region of a facial interface cushion, as will be described in greater detail below.

Insertion mold member 230 may also include a protruding portion 234 that protrudes from outer mold facing surface 232A and inner mold facing surface 232B. As shown in FIG. 10, protruding portion 234 may include a protrusion end surface 236, a protrusion inner side surface 238, and a protrusion peripheral side surface 240. Protrusion end surface 236 may have any suitable surface shape, without, including, for example, a substantially planar surface. Protrusion inner side surface 238 may extend between inner mold facing surface 232B and protrusion end surface 236 and protrusion peripheral side surface may extend between outer mold facing surface 232A and protrusion end surface 236. In some examples, protruding portion 234 may extend along an arcuate path. For example, as shown in FIG. 10, protruding portion 234 may follow a partially-looped path, with protrusion inner side surface 238 formed on an inner portion of the partially-looped path surrounding inner mold facing surface 232B and protrusion peripheral side surface 240 formed on a periphery of the partially-looped path surrounded by outer mold facing surface 232A. In one example, protruding portion 234 may include at least one protrusion sloped surface 235 sloping between an end of protrusion end surface 236 and intermediate mold facing surface 232C. Additionally or alternatively, protruding portion 234 may follow a substantially- or fully-looped path such that inner mold facing surface 232B is substantially or fully surrounded by protruding portion 234.

Protruding portion 234 may have any suitable shape, size, and configuration. While protruding portion 234 may include angular edges as illustrated in FIG. 10, protruding portion 234 may additionally or alternatively include rounded and/or sloped edges and/or surfaces. In some embodiments, insertion mold member 230 may include a plurality of separate protruding portions rather than a single protruding portion 234. In at least one embodiment, insertion mold member 230 may not include a protruding portion extending from outer mold facing surface 232A and inner mold facing surface 232B. Rather, insertion mold member 230 may, for example, include a continuous facing surface (e.g., a substantially planar surface) extending over the regions corresponding to outer mold facing surface 232A, inner mold facing surface 232B, intermediate mold facing surface 232C, and protruding portion 234.

In one embodiment, at least one alignment hole for aligning insertion mold member 230 with recessed mold member 250 shown in FIG. 11 may be defined within insertion mold member 230. For example, as illustrated in FIG. 10, a plurality of outer alignment holes 242A may be defined in insertion mold member 230 extending from outer mold facing surface 232A through at least a portion of insertion mold member 230. Additionally or alternatively, a plurality of inner alignment holes 242B may be defined in insertion mold member 230 extending from inner mold facing surface 232B through at least a portion of insertion mold member 230. One or more of outer alignment holes 242A and/or inner alignment holes 242B may, for example, extend through insertion mold member 230 in a thickness direction (e.g., a direction substantially perpendicular to outer mold facing surface 232A and/or inner mold facing surface 232B) from outer mold facing surface 232A and/or inner mold facing surface 232B to a rear surface of insertion mold member 230 opposite outer mold facing surface 232A and/or inner mold facing surface 232B.

Figure 12:
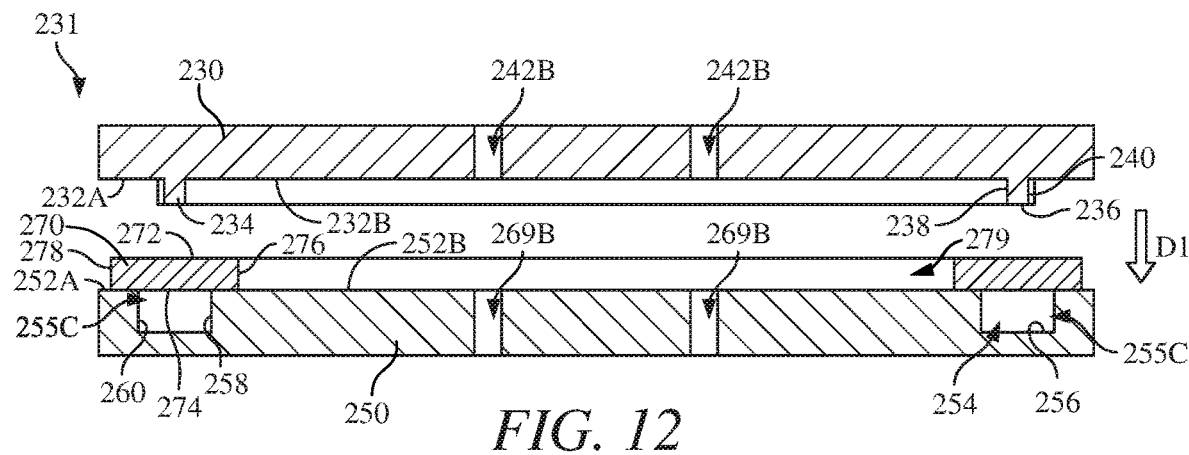
FIG. 12 is a cross-sectional view of a foam layer positioned in an exemplary mold assembly for manufacturing a facial-interface cushion.
Figure 13:
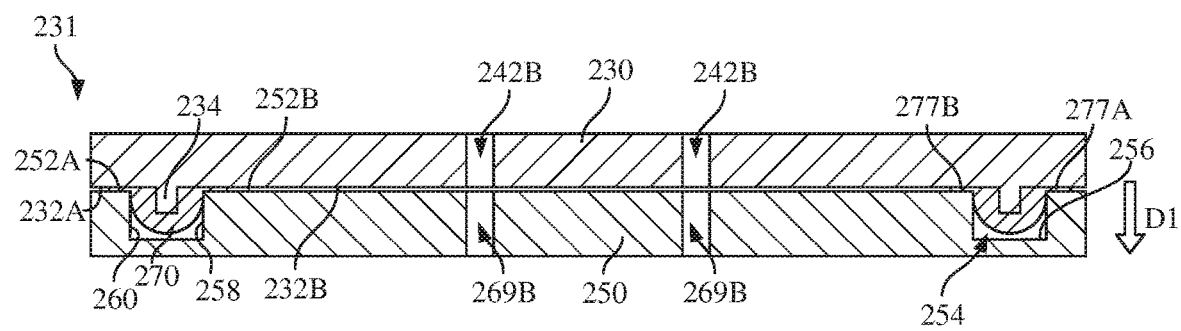
FIG. 13 is a cross-sectional view of a shaped foam element disposed in an exemplary mold assembly for manufacturing a facial-interface cushion.

FIG. 11 illustrates recessed mold member 250, which may include an outer mold facing surface 252A configured to face and/or abut corresponding outer mold facing surface 232A of insertion mold member 230 as part of a mold assembly (e.g., mold assembly 231 illustrated in FIGS. 12 and 13). Additionally, recessed mold member 250 may include an inner mold facing surface 252B configured to face and/or abut corresponding inner mold facing surface 232B of insertion mold member 230 as part of the mold assembly. Outer mold facing surface 252A and inner mold facing surface 252B may each have any suitable surface shape, without limitation. For example, outer mold facing surface 252A and/or inner mold facing surface 252B may be substantially planar surfaces.

Recessed mold member 250 may additionally define a mold channel 254 within a portion of recessed mold member 250. Mold channel 254 may extend into recessed mold member 250 from outer mold facing surface 252A and/or inner mold facing surface 252B. In some examples, mold channel 254 may extend along an arcuate path. For example, as shown in FIG. 11, mold channel 254 may follow a partially-looped path corresponding to a partially-looped path followed by protruding portion 234 of insertion mold member 230 such that protruding portion 234 of insertion mold member 230 is at least partially disposed within mold channel 254 of recessed mold member 250 as part of a mold assembly (e.g., mold assembly 231 illustrated in FIG. 13). Additionally or alternatively, mold channel 254 may follow a substantially- or fully-looped path corresponding to a substantially- or fully-looped path followed by protruding portion 234.

In some embodiments, mold channel 254 may be sized and shaped to hold and form a foam layer (see, e.g., foam layer 170 illustrated in FIG. 4). Mold channel 254 may include various regions corresponding to regions of a facial-interface cushion molded within mold channel 254. For example, mold channel 254 may include a nasal region 255A that molds a portion of a facial-interface cushion dimensioned to abut and/or contact a nasal region of a user's face, cheek regions 255B that mold portions of a facial-interface cushion dimensioned to abut and/or contact cheek regions of a user's face, temple regions 255C that mold portions of a facial-interface cushion dimensioned to abut and/or contact temple regions of a user's face, and a forehead region 255D that molds a portion of a facial-interface cushion dimensioned to abut and/or contact a forehead region of a user's face.

As illustrated in FIG. 11, mold channel 254 may be defined by a channel bottom surface 256, which includes a surface of recessed mold member 250 disposed to a greatest depth within recessed mold member 250 relative to outer mold facing surface 252A and/or inner mold facing surface 252B. Mold channel 254 may also be defined by a channel inner side surface 258 and a channel peripheral side surface 260. Channel inner side surface 258 may define an inner portion of mold channel 254 following an inner portion of an arcuate path surrounding inner mold facing surface 252B and channel peripheral side surface 260 may define a peripheral portion of mold channel 254 following a periphery of the arcuate path surrounded by outer mold facing surface 252A.

In some embodiments, as shown in FIG. 11, mold channel 254 may also be defined by a channel raised surface 262 of recessed mold member 250 that is located at a shallower depth than channel bottom surface 256 relative to outer mold facing surface 252A and/or inner mold facing surface 252B. In one example, as illustrated in FIG. 11, channel raised surface 262 may be substantially congruent with outer mold facing surface 252A and/or inner mold facing surface 252B. In some examples, channel raised surface 262 may define a portion of mold channel 254 in nasal region 255A. In this example, one or more portions of recessed mold member 250 may include channel inclined surfaces 267 sloping between ends of channel raised surface 262 and adjacent portions of channel bottom surface 256.

According to at least one embodiment, at least one alignment hole for aligning recessed mold member 250 with insertion mold member 230 may be defined within recessed mold member 250. For example, as illustrated in FIG. 11, a plurality of outer alignment holes 269A may be defined in recessed mold member 250 extending from outer mold facing surface 252A through at least a portion of recessed mold member 250. Additionally or alternatively, a plurality of inner alignment holes 269B may be defined in recessed mold member 250 extending from inner mold facing surface 252B through at least a portion of recessed mold member 250. One or more of outer alignment holes 269A and/or inner alignment holes 269B may, for example, extend at least partially through recessed mold member 250 in a thickness direction (e.g., a direction substantially perpendicular to outer mold facing surface 252A and/or inner mold facing surface 252B) from outer mold facing surface 252A and/or inner mold facing surface 252B toward a rear surface of recessed mold member 250 opposite outer mold facing surface 252A and/or inner mold facing surface 252B.

FIGS. 12 and 13 are cross-sectional views illustrating a mold assembly 231 for molding a foam layer 270 (see, e.g., foam layer 170 illustrated in FIG. 4) into a facial-interface cushion in accordance with some embodiments. As shown in FIG. 12, foam layer 270 may be loaded between insertion mold member 230 and recessed mold member 250. Foam layer 270 may include any material (e.g., a thermoplastic and/or thermosetting foam material) that is moldable into a facial-interface cushion in a mold assembly when exposed to elevated heat, including any of the materials discussed above in relation to foam layer 170. In at least one embodiment, foam layer 270 may be cut from a larger layer (e.g., a foam sheet) and/or otherwise formed prior to molding. In one embodiment, foam layer 270 may additionally or alternatively be cut following molding to trim away selected portions. As shown, for example, in FIG. 12, foam layer 270 may include a layer upper surface 272 and a layer lower surface 274 opposite layer upper surface 272. Foam layer 270 may also include a layer inner surface 276 and a layer peripheral surface 278 extending between layer upper surface 272 and layer lower surface 274. Layer inner surface 276 may define an opening 279 extending through foam layer 270 in a thickness direction. According to at least one embodiment, an opening may not be defined in foam layer 270. For example, foam layer 270 may be a continuous sheet that is placed in mold assembly 231 and molded, after which a viewing opening may be formed within the molded element by, for example, die cutting.

As shown in FIG. 12, foam layer 270 may be disposed within mold assembly 231 overlapping at least a portion of mold channel 254 defined in recessed mold member 250. In some examples, layer lower surface 274 of foam layer 270 may face toward mold channel 254 and layer upper surface 272 of foam layer 270 may face away from mold channel 254. At least a portion of foam layer 270 may be disposed on outer mold facing surface 252A and/or inner mold facing surface 252B of recessed mold member 250. For example, portions of foam layer 270 may have greater widths than corresponding portions of mold channel 254 overlapped by foam layer 270 such that foam layer 270 substantially or completely overlaps mold channel 254 and regions of outer mold facing surface 252A and inner mold facing surface 252B adjacent to mold channel 254. In some embodiments, foam layer 270 may be a sheet that substantially or completely overlaps inner mold facing surface 252B and at least a portion of outer mold facing surface 252A of recessed mold member 250.

According to some embodiments, insertion mold member 230 and/or recessed mold member 250 may be heated prior to loading foam layer 270 into mold channel 254 and/or between insertion mold member 230 and recessed mold member 250. For example, insertion mold member 230 and/or recessed mold member 250 may be pre-heated to an elevated temperature at or above a specified temperature (e.g., a softening point) for softening foam layer 270. In at least one embodiment, insertion mold member 230 and/or recessed mold member 250 may be maintained at the elevated temperature during molding. In some examples, insertion mold member 230 and/or recessed mold member 250 may be pre-heated to the elevated temperature but may not be further heated during molding. In some embodiments, foam layer 270 may be heated separately from insertion mold member 230 and/or recessed mold member prior to loading foam layer 270 into mold assembly 231. For example, foam layer 270 may be heated to an elevated temperature at or above the specified temperature to soften foam layer 270, after which foam layer 270 may be loaded into mold assembly 231 with or without further heating from insertion mold member 230 and/or recessed mold member 250. In one embodiment, mold assembly 231 may be disposed within a heated vessel to heat mold assembly 231 and foam layer 270 during molding.

Once foam layer 270 is loaded into mold assembly 231, insertion mold member 230 may be moved toward recessed mold member 250 and foam layer 270 in direction D1 shown in FIGS. 12 and 13. Although not illustrated in FIGS. 12 and 13, guides, such as alignment pins, may be disposed within outer alignment holes 242A and/or inner alignment holes 242B defined in insertion mold member 230 and within corresponding outer alignment holes 269A and/or inner alignment holes 269B defined in recessed mold member 250 to guide and/or hold insertion mold member 230 in proper alignment with recessed mold member 250.

As illustrated in FIG. 13, insertion mold member 230 may be moved in direction D1 until insertion mold member 230 is disposed in close proximity to and/or abutting recessed mold member 250. For example, as shown in FIG. 13, outer mold facing surface 232A and inner mold facing surface 232B of insertion mold member 230 may respectively be disposed near to and/or abutting outer mold facing surface 252A and inner mold facing surface 252B of recessed mold member 250. As protruding portion 234 of insertion mold member 230 is inserted into mold channel 254 defined in recessed mold member 250, protrusion end surface 236, outer mold facing surface 232A, and/or inner mold facing surface 232B of insertion mold member 230 may force at least a portion of foam layer 270 overlapping mold channel 254 at least partially into mold channel 254 toward channel bottom surface 256, forming shaped foam element 280 shown in FIG. 13.

As portions of foam layer 270 overlapping mold channel 254 are forced into mold channel 254 by insertion mold member 230, at least a portion of foam layer 270 overlapping regions of outer mold facing surface 252A and/or inner mold facing surface 252B of recessed mold member 250 adjacent to mold channel 254 may be clamped and compressed between these regions of outer mold facing surface 252A and/or inner mold facing surface 252B and adjacent regions of outer mold facing surface 232A and/or inner mold facing surface 232B of insertion mold member 230. For example, as illustrated in FIG. 13, shaped foam element 280 may include an outer clamped portion 277A, which is held and compressed between outer mold facing surface 232A of insertion mold member 230 and outer mold facing surface 252A of recessed mold member 250, and an inner clamped portion 277B, which is held and compressed between inner mold facing surface 232B of insertion mold member 230 and inner mold facing surface 252B of recessed mold member 250. Additionally, a portion of shaped foam element 280 overlapping channel raised surface 262 of recessed mold member 250 shown in FIG. 11 may be clamped between raised surface 262 and intermediate mold facing surface 232C of insertion mold member 230. Foam layer 270 and shaped foam element 280 may be held in place in mold assembly 231 at the clamped regions as insertion mold member 230 is moved adjacent to recessed mold member 250 and during molding of shaped foam element 280.

According to at least one embodiment, as portions of foam layer 270 are forced into mold channel 254 by insertion mold member 230, forming shaped foam element 280, at least a portion of shaped foam element 280 disposed within mold channel 254 may not contact at least a portion of recessed mold member 250 defining mold channel 254. For example, shaped foam element 280 may not contact portions of channel inner side surface 258, channel peripheral side surface 260, and/or channel bottom surface 256, as shown in FIG. 13. In at least one example, shaped foam element 280 may not contact any portion of channel bottom surface 256 during molding. As shown in FIG. 13, for example, shaped foam element 280 may have a curved surface (e.g., a free-form surface) within mold channel 254 that is not formed by portions of channel inner side surface 258, channel peripheral side surface 260, and/or channel bottom surface 256. For example, shaped foam element 280 may arc between outer clamped portion 277A and inner clamped portion 277B, and/or between channel inner side surface 258, channel peripheral side surface 260, within mold channel 254.

Various factors may influence a degree to which shaped foam element 280 does or does not contact various surface regions of recessed mold member 250 defining mold channel 254. Such factors may be varied to form desired surfaces on shaped foam element 280, and likewise on facial-interface cushion 226, during molding. For example, the thickness and density of foam layer 270 may influence a volume of shaped foam element 280 disposed within mold channel 254. If a sufficient volume of foam layer 270 is forced into mold channel 254, portions of shaped foam element 280 may contact portions of channel inner side surface 258, channel peripheral side surface 260, and/or channel bottom surface 256. Additionally, a shape of mold channel 254, such as widths and depths of various portions of mold channel 254, may influence whether shaped foam element 280 contacts portions of channel inner side surface 258, channel peripheral side surface 260, and/or channel bottom surface 256 defining mold channel 254. Moreover, a shape of protruding portion 234 of insertion mold member 230, such as widths and heights of regions of protruding portion 234, may influence whether shaped foam element 280 contacts portions of channel inner side surface 258, channel peripheral side surface 260, and/or channel bottom surface 256 defining mold channel 254. Insertion mold member 230 including protruding portion 234, as shown in FIGS. 10, 12, and 13, may force a volume of shaped foam element 280 further into mold channel 254 than an insertion mold member that does not include protruding portion 234.

In some embodiments, at least a portion of shaped foam element 280 may contact and conform to surface regions of recessed mold member 250 defining mold channel 254. For example, shaped foam element 280 may contact at least a portion of channel raised surface 262 and/or channel inclined surfaces 267 illustrated in FIG. 11. In some embodiments, at least a portion of shaped foam element 280 may contact at least a portion of channel bottom surface 256, channel inner side surface 258, and/or channel peripheral side surface 260. Portions of shaped foam element 280, which is heated to soften the foam material, may conform to and assume a shape corresponding to the surface portions of recessed mold member 250 and insertion mold member 230 contacting shaped foam element 280. In some embodiments, portions of shaped foam element 280 not contacting surface portions of recessed mold member 250 may define curved surfaces arcing between the portions of shaped foam element 280 contacting surface regions of recessed mold member 250, as will be described in greater detail below in reference to FIG. 16.

As shown in FIG. 13, protruding portion 234 of insertion mold member 230 may extend into a portion of shaped foam element 280, forming a channel within shaped foam element 280, as will be described in greater detail below in reference to FIGS. 14-16. Additionally, protruding portion 234 may further push at least a portion of shaped foam element 280 into mold channel 254 of recessed mold member 250. In some embodiments, as shown in FIG. 13, at least a portion of shaped foam element 280 may be disposed between protruding portion 234 and at least a portion of channel bottom surface 256, channel inner side surface 258, and/or channel peripheral side surface 260. In at least one embodiment, insertion mold member 230 may not include a protruding portion extending from outer mold facing surface 232A and inner mold facing surface 232B such that a channel is not formed within shaped foam element 280, as will be described in greater detail below in reference to FIG. 17.

Shaped foam element 280 may be held between insertion mold member 230 and recessed mold member 250 for a time sufficient for shaped foam element 280 to be molded within mold channel 254 of recessed mold member 250, thereby forming facial-interface cushion 226. For example, shaped foam element 280 may be held between insertion mold member 230 and recessed mold member 250, as shown in FIG. 13, for any of the time periods discussed above in reference to shaped foam element 180 and mold assembly 131. In some embodiments, shaped foam element 180 may be subjected to increased pressure during heating and molding, including any of the pressures or ranges of pressures discussed above in reference to shaped foam element 180 and mold assembly 131.

After shaped foam element 280 has been held within mold assembly 231 for a suitable period of time to form facial-interface cushion 226, insertion mold member 230 may be separated from recessed mold member 250 and molded facial-interface cushion 226 may be removed from mold assembly 231. According to some embodiments, facial-interface cushion 226 may be removed from mold assembly 231 and allowed to cool outside of mold assembly 231. For example, facial-interface cushion 226 may be removed from mold channel 254 defined in recessed mold member 250 and cooled to a temperature below the specified temperature (e.g., softening point) to allow facial-interface cushion to solidify and maintain the molded shape. Additionally or alternatively, facial-interface cushion 226 may be at least partially cooled within recessed mold member 250 prior to removing facial-interface cushion 226 from mold assembly 231.

Figure 14:
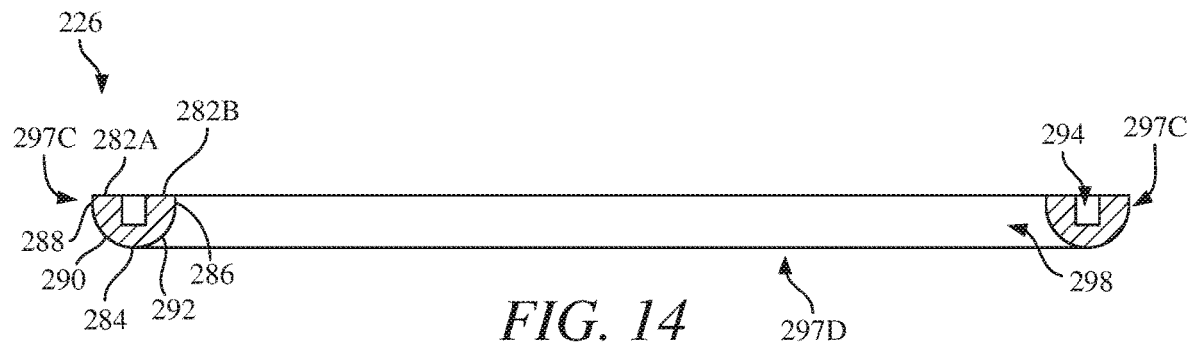
FIG. 14 is a cross-sectional view of an exemplary facial-interface cushion for a head-mounted display.
Figure 15:
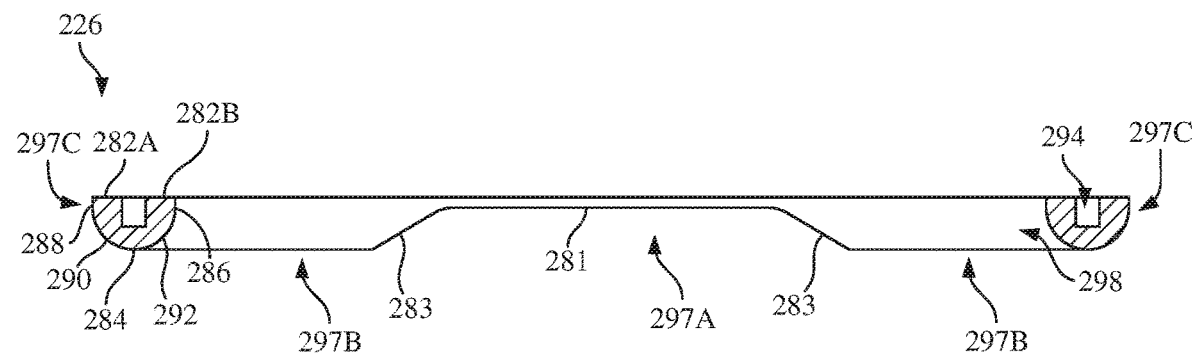
FIG. 15 is a cross-sectional view of an exemplary facial-interface cushion for a head-mounted display.

FIGS. 14 and 15 are cross-sectional views of a facial-interface cushion 226 molded by mold assembly 231 illustrated in FIGS. 12 and 13. While the features shown in FIGS. 14 and 15 are illustrated in relation to facial-interface cushion 226, corresponding features may be present on shaped foam element 280 disposed within mold assembly 231 shown in FIG. 13.

In some embodiments, following molding, as described above in reference to FIGS. 12 and 13, portions of a molded facial-interface cushion may be removed by, for example, cutting to form facial-interface cushion 226 shown in FIGS. 14 and 15. For example, portions of a molded facial-interface cushion formed in mold assembly 231, such as portions corresponding to outer clamped portion 277A and/or inner clamped portion 277B of shaped foam element 280 shown in FIG. 13, may be removed by, for example, die cutting.

Facial-interface cushion 226 may include various regions dimensioned to abut and/or conform to selected portions of a user's face when a head-mounted-display system (e.g., head-mounted-display system 100 shown in FIG. 1) including facial-interface cushion 226 is worn by a user. For example, as shown in FIGS. 14 and 15, facial-interface cushion 226 may include a cushion nasal region 297A corresponding to a nasal region of the user's face, cushion cheek regions 297B corresponding to cheek regions of the user's face, cushion temple regions 297C corresponding to temple regions of the user's face, and a cushion forehead region 297D corresponding to a forehead region of the user's face. In some embodiments, a portion of facial-interface cushion 226 in cushion nasal region 297A may be thinner than other portions of facial-interface cushion 226.

Facial-interface cushion 226 may include a cushion peripheral display-side surface 282A and a cushion inner display-side surface 282B that are dimensioned to abut a mounting member of a head-mounted display (e.g., facial-interface mounting member 124 shown in FIG. 1). Cushion peripheral display-side surface 282A and cushion inner display-side surface 282B may be respectively formed by outer mold facing surface 232A and inner mold facing surface 232B of insertion mold member 230 during molding.

According to at least one embodiment, a cushion channel 294 may be defined in facial-interface cushion 226 extending from cushion peripheral display-side surface 282A and/or cushion inner display-side surface 282B. Cushion channel 294 may have any suitable shape, size, and configuration. In one example, a plurality of separate cushion channels and/or recesses may be defined in facial-interface cushion 226. In some embodiments, cushion channel 294 may be formed by protruding portion 234 of insertion mold member 230, as illustrated in FIG. 13. In some embodiments, cushion channel 294 may facilitate dissipation of heat in facial-interface cushion 226 during use. For example, cushion channel 294 may allow for movement of air within facial-interface cushion 226 and/or between facial-interface cushion 226 and an adjacent region of a head-mounted display (e.g., facial-interface mounting member 124 shown in FIG. 1) to which facial-interface cushion 226 is attached. Such movement of air may cool at least a portion of facial-interface cushion 226, preventing build-up of excess heat in facial-interface cushion 226 and/or a region of a head-mounted display surrounded by facial-interface cushion 226 (e.g., viewing region 122 of head-mounted display 102 shown in FIG. 1). By dissipating heat in facial-interface cushion 226, cushion channel 294 may prevent fogging of lenses of a head-mounted display (e.g., lenses 104 of head-mounted display 102 illustrated in FIG. 1) and/or lenses worn by a user (e.g., eyeglass lenses) during use. Additionally, cushion channel 294 may prevent user discomfort by dissipating heat in regions of facial-interface cushion 226 contacting the user's face.

Facial-interface cushion 226 may also include a cushion user-side surface 284 dimensioned to abut facial regions of a user. For example, cushion user-side surface 284 may be configured to contact and/or conform to at least a portion of the user's nose, cheek, temple, and/or forehead facial regions. According to some embodiments, facial-interface cushion 226 may include a cushion inner side surface 286 extending from cushion inner display-side surface 282B and a cushion peripheral side surface 288 extending from cushion peripheral display-side surface 282A in a thickness direction of facial-interface cushion 226. As shown in FIGS. 14 and 15, cushion inner side surface 286 may define a viewing opening 298 extending through facial-interface cushion 226.

According to at least one embodiment, facial-interface cushion 226 may include a cushion recessed surface 281 in cushion nasal region 297A. Cushion recessed surface 281 may be formed by channel raised surface 262 of recessed mold member 250 during molding and may have any suitable shape, size, and configuration. A portion of facial-interface cushion 226 between cushion recessed surface 281 and cushion peripheral display-side surface 282A and/or cushion inner display-side surface 282B may be thinner than other portions of facial-interface cushion 226 between cushion user-side surface 284 and cushion peripheral display-side surface 282A and/or cushion inner display-side surface 282B. Facial-interface cushion 226 may also include cushion inclined surfaces 283 sloping from cushion recessed surface 281 to adjacent portions of cushion user-side surface 284. Cushion inclined surfaces 283 may be formed by channel inclined surfaces 267 of recessed mold member 250 during molding.

According to some embodiments, facial-interface cushion 226 may include a cushion peripheral curved surface 290 and/or a cushion inner curved surface 292 arcing from at least a portion of cushion user-side surface 284 toward cushion peripheral display-side surface 282A or cushion inner display-side surface 282B. For example, cushion peripheral curved surface 290 may arc between at least a peripheral side of cushion user-side surface 284 and at least a portion of cushion peripheral side surface 288, as shown in FIGS. 14 and 15. In at least one example, cushion peripheral curved surface 290 may additionally or alternatively arc between at least a peripheral side portion of cushion recessed surface 281 and/or cushion inclined surfaces 283 and at least a portion of cushion peripheral side surface 288. In at least one embodiment, as shown in FIGS. 14 and 15, cushion peripheral curved surface 290 may be formed around a substantial or entire peripheral portion of facial-interface cushion 226, including peripheral portions of facial-interface cushion 226 in cushion nasal region 297A, cushion cheek regions 297B, cushion temple regions 297C, and cushion forehead region 297D.

Cushion inner curved surface 292 may arc between at least an inner side of cushion user-side surface 284 surrounding viewing opening 298 and at least a portion of cushion inner side surface 286, as shown in FIGS. 14 and 15. In at least one example, cushion inner curved surface 292 may additionally or alternatively arc between at least an inner side portion of cushion recessed surface 281 and/or cushion inclined surfaces 283 surrounding viewing opening 298 and at least a portion of cushion inner side surface 286. In at least one embodiment, as shown in FIGS. 14 and 15, cushion inner curved surface 292 may be formed around a substantial or entire inner portion of facial-interface cushion 226 surrounding viewing opening 298, including inner portions of facial-interface cushion 226 in cushion nasal region 297A, cushion cheek regions 297B, cushion temple regions 297C, and cushion forehead region 297D. Cushion inner curved surface 292 may define a portion of viewing opening 298. In some embodiments, at least a portion of cushion peripheral curved surface 290 and/or cushion inner curved surface 292 may arc between at least a portion of cushion user-side surface 284, cushion recessed surface 281, and/or cushion inclined surface 283 and at least a portion of cushion inner display-side surface 282B or cushion peripheral display-side surface 282A.

In some embodiments, at least a portion of cushion user-side surface 284, cushion peripheral curved surface 290, cushion inner curved surface 292, cushion peripheral side surface 288, and/or cushion inner side surface 286 may be formed without contacting a surface region of recessed mold member 250 defining mold channel 254 during molding (see, e.g., FIG. 13). For example, facial-interface cushion 226 may include free-form surfaces and/or surface regions, which are not formed by contacting surface regions of recessed mold member 250 during molding. Such free-form surfaces and/or surface regions may extend from cushion inner side surface 286 to cushion peripheral side surface 288 and may include at least a portion of cushion user-side surface 284, cushion peripheral curved surface 290, cushion inner curved surface 292, cushion peripheral side surface 288, and cushion inner side surface 286. Cushion peripheral curved surface 290 and/or cushion inner curved surface 292 may contact portions of a user's face at inner and peripheral regions of cushion user-side surface 284, cushion recessed surface 281, and/or cushion inclined surface 283 when a head-mounted-display system (e.g., head-mounted-display system 100 illustrated in FIG. 1) including facial-interface cushion 226 is worn by the user.

Figure 16:
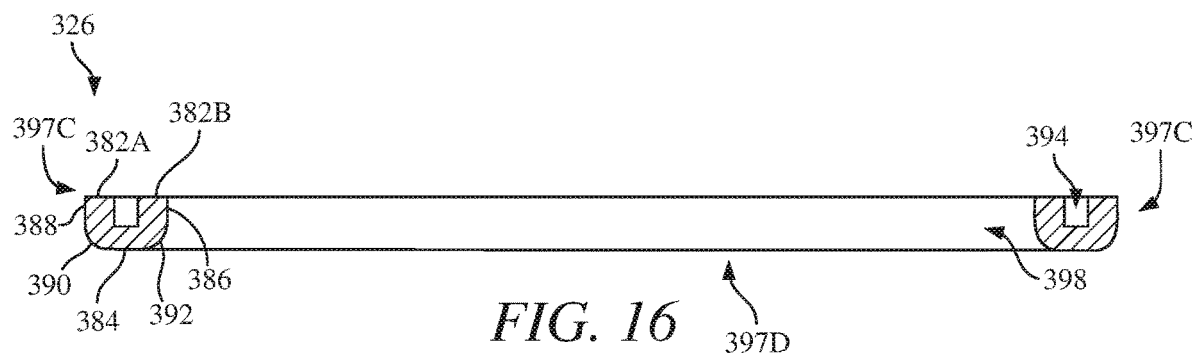
FIG. 16 is a cross-sectional view of an exemplary facial-interface cushion for a head-mounted display.

FIG. 16 shows a facial-interface cushion 326 according to some embodiments. Facial-interface cushion 326 may include both surfaces formed by contacting surface portions of a recessed mold member (e.g., recessed mold member 250 illustrated in FIGS. 11-13) of a mold assembly and free-form surfaces formed without contacting surface portions of the recessed mold member during molding.

Facial-interface cushion 326 may include various regions dimensioned to abut and/or conform to selected portions of a user's face when a head-mounted-display system (e.g., head-mounted-display system 100 shown in FIG. 1) including facial-interface cushion 326 is worn by the user. For example, as shown in FIG. 16, facial-interface cushion 326 may include cushion temple regions 397C corresponding to temple regions of the user's face and a cushion forehead region 397D corresponding to a forehead region of the user's face. While not illustrated in FIG. 16, facial-interface cushion 326 may also include a cushion nasal region (see, e.g., cushion nasal region 297A shown in FIG. 15) corresponding to a nasal region of the user's face and cushion cheek regions (see, e.g., cushion cheek regions 297B shown in FIG. 15) corresponding to cheek regions of the user's face.

Facial-interface cushion 326 may include a cushion peripheral display-side surface 382A and a cushion inner display-side surface 382B that are dimensioned to abut a mounting member of a head-mounted display (e.g., facial-interface mounting member 124 shown in FIG. 1). A cushion channel 394 may be defined in facial-interface cushion 326 extending from cushion peripheral display-side surface 382A and/or cushion inner display-side surface 382B.

Facial-interface cushion 326 may also include a cushion user-side surface 384 dimensioned to abut facial regions of a user.

According to some embodiments, facial-interface cushion 326 may include a cushion inner side surface 386 extending from cushion inner display-side surface 382B and a cushion peripheral side surface 388 extending from cushion peripheral display-side surface 382A in a thickness direction of facial-interface cushion 326. As shown in FIG. 16, cushion inner side surface 386 may define a viewing opening 398 extending through facial-interface cushion 326. In at least one embodiment, facial-interface cushion 326 may include a cushion peripheral curved surface 390 and/or a cushion inner curved surface 392 arcing from at least a portion of cushion user-side surface 384 toward cushion peripheral display-side surface 382A or cushion inner display-side surface 382B. For example, cushion peripheral curved surface 390 may arc between at least a peripheral side of cushion user-side surface 384 and at least a portion of cushion peripheral side surface 388, as shown in FIG. 16. Cushion inner curved surface 392 may arc between at least an inner side of cushion user-side surface 384 surrounding viewing opening 398 and at least a portion of cushion inner side surface 386.

In some embodiments, one or more surfaces and/or surface regions of facial-interface cushion 326 may be formed by contacting corresponding surface portions of a recessed mold member during molding of facial-interface cushion 326. For example, cushion user-side surface 384, cushion inner side surface 386, and/or cushion peripheral side surface 388 may be formed by contacting corresponding surface portions of a recessed mold member during molding. For example, cushion user-side surface 384, cushion inner side surface 386, and/or cushion peripheral side surface 388 may be formed in mold assembly 231 shown in FIGS. 12 and 13 by respectively contacting portions of channel bottom surface 256, channel inner side surface 258, and/or channel peripheral side surface 160 of recessed mold member 250 defining mold channel 254 during molding.

In some embodiments, at least a portion of cushion peripheral curved surface 390 and/or cushion inner curved surface 392 may be formed without contacting a surface region of a recessed mold member (see, e.g., recessed mold member 250 defining mold channel 254 as shown in FIGS. 11-13). For example, facial-interface cushion 326 may include free-form surfaces and/or surface regions, which are not formed by contacting surface regions of a recessed mold member during molding. Cushion peripheral curved surface 390 and/or cushion inner curved surface 392 may contact portions of a user's face at inner and peripheral regions of cushion user-side surface 384 when a head-mounted-display system (e.g., head-mounted-display system 100 illustrated in FIG. 1) including facial-interface cushion 326 is worn by the user.

Figure 17:
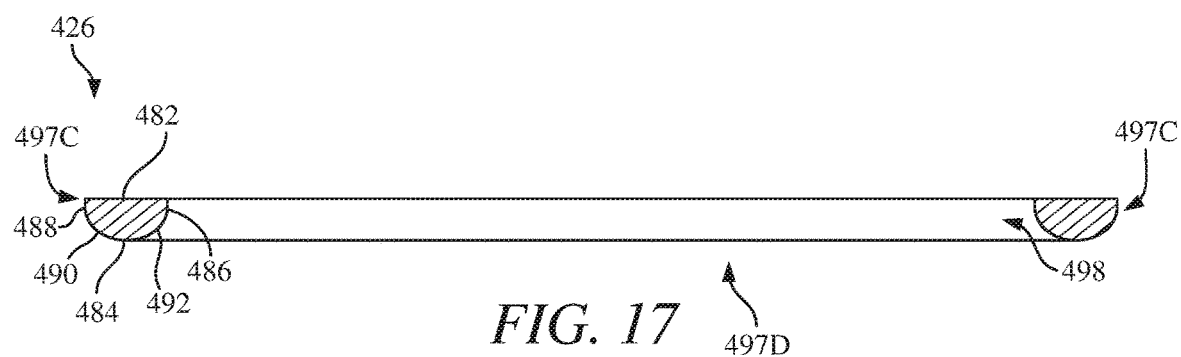
FIG. 17 is a cross-sectional view of an exemplary facial-interface cushion for a head-mounted display.

FIG. 17 shows a facial-interface cushion 426 according to some embodiments. Facial-interface cushion 426 may be formed without a channel and may include free-form surfaces formed without contacting surface portions of a mold assembly during molding.

Facial-interface cushion 426 may include various regions dimensioned to abut and/or conform to selected portions of a user's face when a head-mounted-display system (e.g., head-mounted-display system 100 shown in FIG. 1) including facial-interface cushion 426 is worn by the user. For example, as shown in FIG. 17, facial-interface cushion 426 may include cushion temple regions 497C corresponding to temple regions of the user's face and a cushion forehead region 497D corresponding to a forehead region of the user's face. While not illustrated in FIG. 17, facial-interface cushion 426 may also include a cushion nasal region (see, e.g., cushion nasal region 297A shown in FIG. 15) corresponding to a nasal region of the user's face and cushion cheek regions (see, e.g., cushion cheek regions 297B shown in FIG. 15) corresponding to cheek regions of the user's face.

Facial-interface cushion 426 may include a cushion display-side surface 482 dimensioned to abut a mounting member of a head-mounted display (e.g., facial-interface mounting member 124 shown in FIG. 1). In contrast to facial-interface cushion 226 shown in FIGS. 14 and 15 and facial-interface cushion 326 shown in FIG. 16, facial-interface cushion 426 shown in FIG. 17 may not include a cushion channel (e.g., cushion channel 294 shown in FIGS. 14 and 15 or cushion channel 294 shown in FIG. 16) defined in facial-interface cushion. Cushion display-side surface 482 of facial-interface cushion 426 may, for example, be molded by an insertion mold member that does not include a protruding portion, such as protruding portion 234 of insertion mold member 230 shown in FIGS. 10, 12, and 13. Cushion display-side surface 482 may have any suitable shape, size, and configuration. For example, cushion display-side surface 482 may be a generally planar surface prior to mounting facial-interface cushion 426 to a corresponding mounting surface of a head-mounted display (e.g., head-mounted display 102 shown in FIG. 1).

Facial-interface cushion 426 may also include a cushion user-side surface 484 dimensioned to abut facial regions of a user. According to some embodiments, facial-interface cushion 426 may include a cushion inner side surface 486 and a cushion peripheral side surface 488 extending from cushion display-side surface 482 in a thickness direction of facial-interface cushion 426. As shown in FIG. 17, cushion inner side surface 486 may define a viewing opening 498 extending through facial-interface cushion 426. In at least one embodiment, facial-interface cushion 426 may include a cushion peripheral curved surface 490 and/or a cushion inner curved surface 492 arcing from at least a portion of cushion user-side surface 484 toward cushion display-side surface 482. For example, cushion peripheral curved surface 490 may arc between at least a peripheral side of cushion user-side surface 484 and at least a portion of cushion peripheral side surface 488, as shown in FIG. 17. Cushion inner curved surface 492 may arc between at least an inner side of cushion user-side surface 484 surrounding viewing opening 498 and at least a portion of cushion inner side surface 486.

In some embodiments, at least a portion of cushion user-side surface 484, cushion peripheral curved surface 490, cushion inner curved surface 492, cushion peripheral side surface 488, and/or cushion inner side surface 486 may be formed without contacting a surface region of recessed mold member 450 defining mold channel 454 during molding (see, e.g., FIG. 13). For example, facial-interface cushion 426 may include free-form surfaces and/or surface regions, which are not formed by contacting surface regions of a recessed mold member (e.g., recessed mold member 250 shown in FIGS. 11-13) during molding. Such free-form surfaces and/or surface regions may extend from cushion inner side surface 486 to cushion peripheral side surface 488 and may include at least a portion of cushion user-side surface 484, cushion peripheral curved surface 490, cushion inner curved surface 492, cushion peripheral side surface 488, and cushion inner side surface 486. Cushion peripheral curved surface 490 and/or cushion inner curved surface 492 may contact portions of a user's face at inner and peripheral regions of cushion user-side surface 484 when a head-mounted-display system (e.g., head-mounted-display system 100 illustrated in FIG. 1) including facial-interface cushion 426 is worn by the user.

Figure 18:
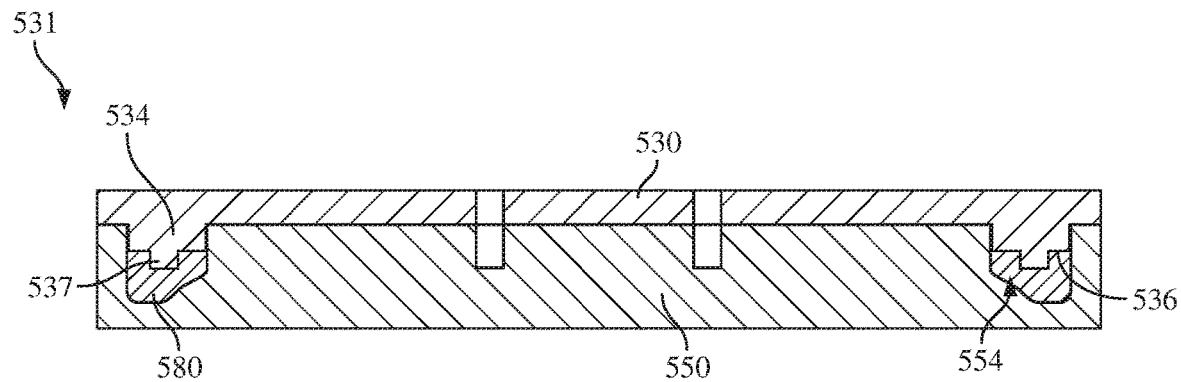
FIG. 18 is a cross-sectional view of a shaped foam element disposed in an exemplary mold assembly for manufacturing a facial-interface cushion.

FIG. 18 is a cross-sectional view illustrating a mold assembly 531 for molding a foam layer (see, e.g., foam layer 170 illustrated in FIG. 4) into a facial-interface cushion having a cushion channel in accordance with some embodiments.

As illustrated in FIG. 18, mold assembly 531 may include an insertion mold member 530 and a recessed mold member 550. Insertion mold member 530 and recessed mold member 550 may include any of the features discussed above in relation to insertion mold member 130 and recessed mold member 150 shown in FIGS. 2, 3, 5, and 6. Additionally, as shown in FIG. 18, insertion mold member 530 may include a secondary protruding portion 537 extending from protruding portion 534. For example, secondary protruding portion 537 may extend from protrusion end surface 536.

In some embodiments, secondary protruding portion 537 may form a cushion channel within a molded facial-interface cushion during molding. As shown, for example, in FIG. 18, secondary protruding portion 537 of insertion mold member 530 may extend into a portion of a shaped foam element 580 disposed within mold channel 554 between insertion mold member 530 and recessed mold member 550, forming a channel within shaped foam element 580. In one example, protrusion end surface 536 of protruding portion 534 and secondary protruding portion 537 may force shaped foam element 580 against surface portions of recessed mold member 550 defining mold channel 554 during molding, as discussed in greater detail above in relation to FIG. 6. In some embodiments, as shown in FIG. 18, at least a portion of shaped foam element 580 may be disposed between secondary protruding portion 537 and at least a portion of a recessed mold member 550 defining mold channel 554.

Figure 19:
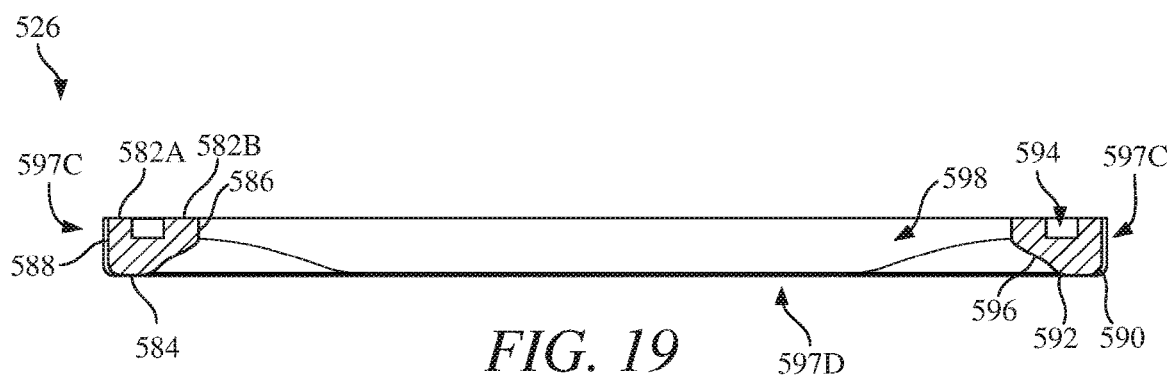
FIG. 19 is a cross-sectional view of an exemplary facial-interface cushion for a head-mounted display.

FIG. 19 is a cross-sectional view of a facial-interface cushion 526 molded by mold assembly 531 illustrated in FIG. 18. While the features shown in FIG. 19 are illustrated in relation to facial-interface cushion 526, corresponding features may be present on shaped foam element 580 disposed within mold assembly 531 shown in FIG. 18.

Facial-interface cushion 526 may include various regions dimensioned to abut and/or conform to selected portions of a user's face when a head-mounted-display system (e.g., head-mounted-display system 100 shown in FIG. 1) including facial-interface cushion 526 is worn by the user. For example, as shown in FIG. 19, facial-interface cushion 526 may include cushion temple regions 597C corresponding to temple regions of the user's face and a cushion forehead region 597D corresponding to a forehead region of the user's face. While not illustrated in FIG. 19, facial-interface cushion 526 may also include a cushion nasal region (see, e.g., cushion nasal region 197A shown in FIGS. 8 and 9) corresponding to a nasal region of the user's face and cushion cheek regions (see, e.g., cushion cheek regions 197B shown in FIGS. 8 and 9) corresponding to cheek regions of the user's face.

Facial-interface cushion 526 may include a cushion peripheral display-side surface 582A and a cushion inner display-side surface 582B that are dimensioned to abut a mounting member of a head-mounted display (e.g., facial-interface mounting member 124 shown in FIG. 1). Cushion peripheral display-side surface 582A and cushion inner display-side surface 582B may be formed by protrusion end surface 536 of protruding portion 534 of insertion mold member 530 during molding.

According to at least one embodiment, cushion channel 594 may be defined in facial-interface cushion 526 extending from cushion peripheral display-side surface 582A and/or cushion inner display-side surface 582B. Cushion channel 594 may have any suitable shape, size, and configuration. In one example, a plurality of separate cushion channels and/or recesses may be defined in facial-interface cushion 526. In some embodiments, cushion channel 594 may be formed by secondary protruding portion 537 of insertion mold member 530, as illustrated in FIG. 18. Cushion channel 594 may facilitate dissipation of heat in facial-interface cushion 526 during use.

According to some embodiments, facial-interface cushion 526 may also include a cushion user-side surface 584 dimensioned to abut facial regions of a user. Facial-interface cushion 526 may also include a cushion inner side surface 586 extending from cushion inner display-side surface 582B and a cushion peripheral side surface 588 extending from cushion peripheral display-side surface 582A in a thickness direction of facial-interface cushion 526. As shown in FIG. 19, cushion inner side surface 586 may define a viewing opening 598 extending through facial-interface cushion 526. In at least one embodiment, facial-interface cushion 526 may include at least one cushion sloped surface 596 extending between at least a portion of cushion user-side surface 584 and at least a portion of cushion inner side surface 586. For example, as shown in FIG. 19, facial-interface cushion 526 may include a cushion sloped surface 596 in each of cushion temple regions 597C.

In at least one embodiment, facial-interface cushion 526 may include a cushion peripheral curved surface 590 and/or a cushion inner curved surface 592 arcing from at least a portion of cushion user-side surface 584 toward cushion peripheral display-side surface 582A or cushion inner display-side surface 582B. For example, cushion peripheral curved surface 590 may arc between at least a peripheral side of cushion user-side surface 584 and at least a portion of cushion peripheral side surface 588, as shown in FIG. 19. Cushion inner curved surface 592 may arc between at least an inner side of cushion user-side surface 584 surrounding viewing opening 598 and at least a portion of cushion inner side surface 586 and/or cushion sloped surfaces 596.

In some embodiments, one or more surfaces and/or surface regions of facial-interface cushion 526 may be formed by contacting corresponding surface portions of recessed mold member 550 shown in FIG. 18 during molding of facial-interface cushion 526. For example, cushion user-side surface 584, cushion inner side surface 586, and/or cushion peripheral side surface 588 may be formed by contacting corresponding surface portions of recessed mold member 550 during molding. In one example, cushion user-side surface 584, cushion inner side surface 586, and/or cushion peripheral side surface 588 may be formed in mold assembly 531 shown in FIG. 18 by respectively contacting portions of a channel bottom surface, a channel inner side surface, and/or a channel peripheral side surface of recessed mold member 550 defining mold channel 554 during molding. Cushion peripheral curved surface 590 and/or cushion inner curved surface 592 may contact portions of a user's face at inner and peripheral regions of cushion user-side surface 584 when a head-mounted-display system (e.g., head-mounted-display system 100 illustrated in FIG. 1) including facial-interface cushion 526 is worn by the user.

Figure 20:
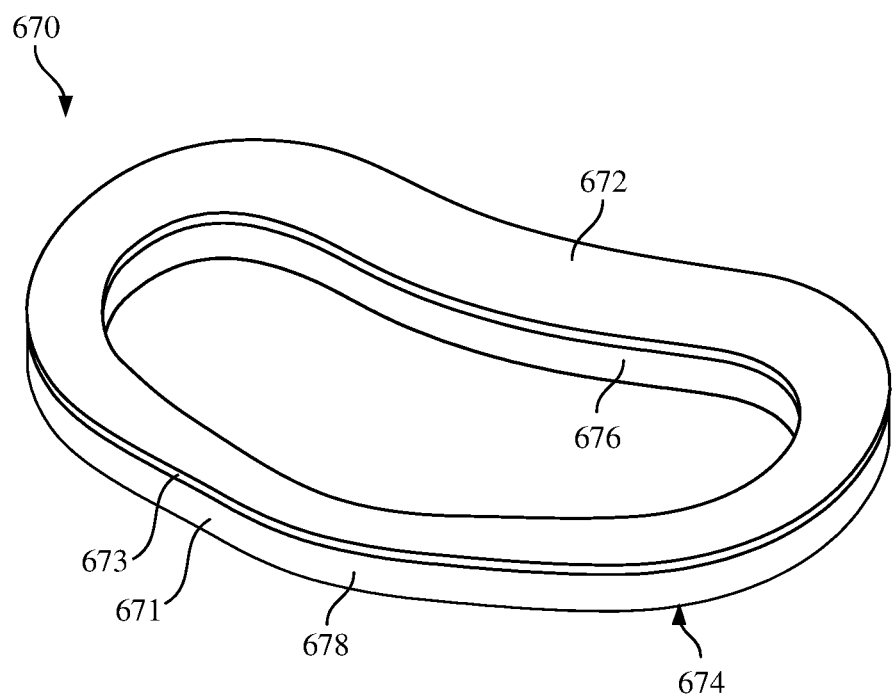
FIG. 20 is a perspective view of an exemplary foam layer assembly for producing a facial-interface cushion for a head-mounted display.

FIG. 20 is a perspective view showing an exemplary foam layer assembly 670 for producing a facial-interface cushion (e.g., facial-interface cushions 126, 226, 326, 426, and 526 respectively shown in FIGS. 7-9, 14-17, and 19) according to some embodiments. In some embodiments, a foam layer disposed in a mold assembly may include a foam layer assembly 670 having a plurality of layers and/or materials.

As shown in FIG. 20, foam layer assembly 670 may include an assembly upper surface 672 and an assembly lower surface 674 opposite assembly upper surface 672. Foam layer assembly 670 may also include an assembly inner surface 676 and an assembly peripheral surface 678 extending between assembly upper surface 672 and assembly lower surface 674. Assembly inner surface 676 may define an opening 679 extending through foam layer assembly 670 in a thickness direction. Foam layer assembly 670 may be any suitable size, shape, and/or thickness. In some examples, foam layer assembly 670 may have a substantially constant thickness over its length and width.

According to some embodiments, foam layer assembly 670 may include a plurality of layers. For example, as shown in FIG. 20, foam layer assembly 670 may include a foam layer 671 including a foam material (e.g., a reticulated foam layer) as described herein and a secondary layer 673, which forms assembly upper surface 672, overlapping foam layer 671. Secondary layer 673 may partially or fully overlap foam layer 671. In at least one embodiment, secondary layer 673 may alternatively be disposed on an opposite side of foam layer so as to form assembly lower surface 674 of foam layer assembly 670. Foam layer assembly 670 may additionally or alternatively include any other suitable layers, without limitation. For example, foam layer 671 may be sandwiched between at least two separate overlapping layers. In at least one embodiment, foam layer 671 may include any material described in reference to foam layer 170. For example, foam layer 671 may include a material (e.g., a thermoplastic and/or thermosetting polymer material) that is moldable into facial-interface cushion 126 in a mold assembly when exposed to elevated heat.

Secondary layer 673 may include any suitable material for forming a facial-interface cushion in conjunction with foam layer 671 during molding. In one example, secondary layer 673 may include a moldable foam material (e.g., a thermoplastic and/or thermosetting polymer material) and/or a non-moldable foam material. In some examples, secondary layer 673 may include a material (e.g., a hot-melt adhesive, etc.) for bonding a molded facial-interface cushion to a mounting portion of a head-mounted display (e.g., facial-interface mounting member 124 of head-mounted display 102 shown in FIG. 1). In at least one embodiment, secondary layer 673 may include a material (e.g., polymer, leather, cloth, woven, etc.) configured to comfortably contact portions of a user's face and/or protect foam layer 671 from wear and/or degradation. In some embodiments, secondary layer 673 may be adhered to foam layer 671 prior to molding foam layer assembly 670. In at least one embodiment, secondary layer 673 may be adhered to foam layer 671 during molding to form a facial-interface cushion.

Figure 21:
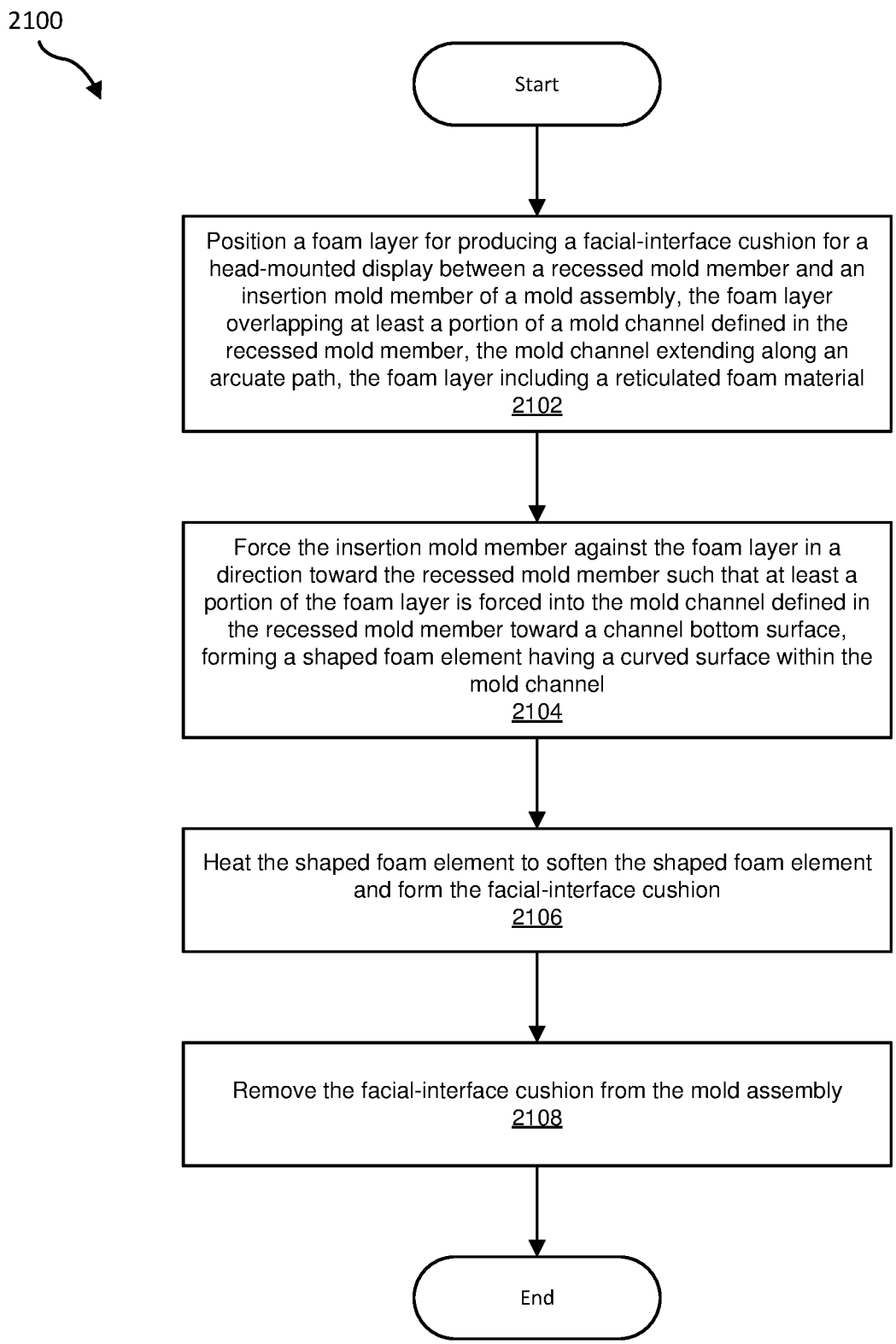
FIG. 21 is a block diagram of an exemplary method for manufacturing a facial-interface cushion for a head-mounted display.

FIG. 21 is a flow diagram of an exemplary method 2100 for manufacturing a facial-interface cushion for a head-mounted display according to any of the embodiments disclosed herein. Steps shown in FIG. 21 may be performed by an individual and/or by any suitable manual and/or automated apparatus.

As illustrated in FIG. 21, at step 2102, a foam layer for producing a facial-interface cushion for a head-mounted display may be positioned between a recessed mold member and an insertion mold member of a mold assembly, with the foam layer overlapping at least a portion of a mold channel defined in the recessed mold member and the mold channel extending along an arcuate path. The foam layer may include a reticulated foam material. For example, foam layer 170, which includes a reticulated foam material, may be positioned between recessed mold member 150 and insertion mold member 130 of mold assembly 131 (see, e.g., FIGS. 4 and 5; see also FIGS. 12 and 20). Foam layer 170 may overlap at least a portion of mold channel 154 defined in recessed mold member 150. Additionally, mold channel 154 may extend along an arcuate path, such a looped or partially looped path.

In some embodiments, the foam layer may include a thermoplastic material and/or a thermosetting material. For example, foam layer 170 may include a thermoplastic material or a thermosetting material, such as a thermoplastic and/or thermosetting polymer material (see, e.g., FIG. 4; see also FIG. 20). In at least one embodiment, the foam layer may include a plurality of separate layers. For example, a foam layer disposed in a mold assembly may include foam layer assembly 670 having a plurality of separate layers, such as foam layer 671 and secondary layer 673 (see, e.g., FIG. 20).

At step 2104 in FIG. 21, the insertion mold member may be forced against the foam layer in a direction toward the recessed mold member such that at least a portion of the foam layer is forced into the mold channel defined in the recessed mold member toward a channel bottom surface, forming a shaped foam element having a curved surface within the mold channel. For example, insertion mold member 130 may be forced against foam layer 170 in a direction D1 toward recessed mold member 150 such that at least a portion of foam layer 170 is forced into mold channel 154 toward channel bottom surface 156, forming shaped foam element 180 having a curved surface within mold channel 154 (see, e.g., FIGS. 5-8; see also FIGS. 12-19).

In some embodiments, at least a portion of the curved surface of the shaped foam element may contact a curved surface of the recessed mold member defining at least a portion of the mold channel. For example, cushion peripheral curved surface 190 and/or cushion inner curved surface 192 may respectively contact channel peripheral curved surface 164 and/or channel inner curved surface 166 of recessed mold member 150 defining at least a portion of mold channel 154 (see, e.g., FIGS. 5-9; see also FIG. 18).

According to at least one embodiment, the curved surface of the shaped foam element may not contact at least a portion of the recessed mold member defining the mold channel. For example, cushion peripheral curved surface 290 and/or cushion inner curved surface 292 may not contact at least a portion of recessed mold member 250 defining mold channel 254 (see, e.g., FIGS. 13-15; see also FIGS. 16 and 17).

According to some embodiments, the shaped foam element may be entirely disposed within the mold channel defined in the recessed mold member. For example, shaped foam element 180 may be entirely disposed within mold channel 154 defined in recessed mold member 150 (see, e.g., FIG. 6; see also FIG. 18).

In at least one embodiment, a portion of the shaped foam element may be disposed outside the mold channel defined in the recessed mold member. For example, outer clamped portion 277A and/or inner clamped portion 277B of shaped foam element 280 may be disposed outside mold channel 254 defined in recessed mold member 250 (see, e.g., FIG. 13). The portion of the shaped foam element disposed outside the mold channel may be compressed between a surface of the recessed mold member and a surface of the insertion mold member facing the surface of the recessed mold member. For example, outer clamped portion 277A of shaped foam element 280 may be compressed between outer mold facing surface 232A of insertion mold member 230 and outer mold facing surface 252A of recessed mold member 250 (see, e.g., FIG. 13). Likewise, inner clamped portion 277B of shaped foam element 280 may be compressed between inner mold facing surface 232B of insertion mold member 230 and inner mold facing surface 252B of recessed mold member 250.

According to some embodiments, the insertion mold member may include a protruding portion sized to fit within the mold channel defined in the recessed mold member. For example, protruding portion 134 of insertion mold member 130 may be sized to fit within mold channel 154 defined in recessed mold member 150 (see, e.g., FIG. 6; see also FIGS. 13 and 18). According to at least one embodiment, forcing the insertion mold member against the foam layer may further include forcing the protruding portion of the insertion mold member against a portion of the foam layer overlapping at least the portion of the mold channel defined in the recessed mold member. For example, protruding portion 134 of insertion mold member 130 may be forced against a portion of foam layer 170 overlapping at least a portion of mold channel 154 defined in recessed mold member 150 (see, e.g., FIGS. 5 and 6; see also FIGS. 12, 13, and 18). In some examples, the protruding portion of the insertion mold member may form a foam channel defined within the shaped foam element. For example, protruding portion 234 of insertion mold member 230 may form a foam channel defined within shaped foam element 280 (see, e.g., FIGS. 13-15; see also FIGS. 16, 18, and 19).

At step 2106 in FIG. 21, the shaped foam element may be heated to soften the shaped foam element and form the facial-interface cushion. For example, shaped foam element 180 may be heated to a temperature sufficient to soften shaped foam element 180 and form the facial-interface cushion 126. (See, e.g., FIGS. 6-9; see also FIGS. 13-19). In some embodiments, shaped foam element 180 may be heated above a specified temperature allowing for softening of shaped foam element 180 and below a temperature at which shaped foam element 180 may begin to melt and/or otherwise lose its structural integrity. For example, shaped foam element 180 including a thermoplastic open-cell polyurethane foam may be heated at a temperature in a range of between approximately 150° C. and approximately 190° C. during molding.

At step 2108 in FIG. 21, the facial-interface cushion may be removed from the mold assembly. For example, facial-interface cushion 126 may be removed from mold assembly 131. (See, e.g., FIGS. 7-9; see also FIGS. 14-17 and 19).

The process parameters and sequence of steps described and/or illustrated herein are given by way of example only and can be varied as desired. For example, while the steps illustrated and/or described herein may be shown or discussed in a particular order, these steps do not necessarily need to be performed in the order illustrated or discussed to manufacture a facial-interface cushion. The various exemplary methods described and/or illustrated herein may also omit one or more of the steps described or illustrated herein or include additional steps in addition to those disclosed.

As discussed throughout the instant disclosure, the disclosed methods, systems, and devices may provide one or more advantages over conventional facial-interface cushions for head-mounted-display systems. For example, the facial-interface cushions described herein may provide comfortable contact regions, including curved inner and peripheral surfaces, abutting facial regions of users wearing head-mounted displays. As such, the described facial-interface cushions may increase user comfort without adding bulk to the facial-interface systems. Furthermore, the facial-interface cushions may include channels that allow for movement of air and facilitate dissipation of heat, preventing user discomfort and fogging of head-mounted display lenses and eyeglasses worn by users. Additionally, the described methods may enable manufacturing of facial-interface cushions having a variety of beneficial features, such as the curved surface portions and cooling channels. In general, the facial-interface cushions and related head-mounted-display systems disclosed herein may improve immersion and/or enjoyment of using a head-mounted display, making virtual- and augmented-reality experiences more fulfilling or useful.

The foregoing description, for purposes of explanation, has been described with reference to specific embodiments and has been provided to enable others skilled in the art to best utilize various aspects of the example embodiments disclosed herein. However, the illustrative discussions above are not intended to be exhaustive or to limit the scope of the claims to the precise forms disclosed. Many modifications and variations are possible in view of the above teachings without departing from the spirit and scope of the instant disclosure. The instant disclosure covers all modifications, equivalents, and alternatives falling within the scope of the appended claims. Features from any of the above-mentioned embodiments may be used in combination with one another in accordance with the general principles described herein. The embodiments were chosen to best explain the principles underlying the claims and their practical applications, to thereby enable others skilled in the art to best use the embodiments with various modifications as are suited to the particular uses contemplated. The embodiments disclosed herein should be considered in all respects illustrative and not restrictive. Reference should be made to the appended claims and their equivalents in determining the scope of the instant disclosure.

Where a range of values is provided, it is to be understood that each intervening value between the upper and lower limit of that range, and any other stated or intervening value in that stated range, is encompassed within the scope of the present disclosure. Where the stated range includes upper or lower limits, ranges excluding either of those included limits are also included in the present disclosure.

The terminology used in the description of the various described embodiments herein is for the purpose of describing particular embodiments only and is not intended to be limiting. As used in the description of the various described embodiments and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "exemplary" is used herein in the sense of "serving as an example, instance, or illustration" and not in the sense of "representing the best of its kind." Unless otherwise noted, the terms "connected to,"

"coupled to," and "attached to" (and their derivatives), as used in the specification and claims, are to be construed as permitting both direct and indirect (i.e., via other elements or components) connection. Furthermore, two or more elements may be coupled together with an adhesive, a clasp, a latch, a hook, a link, a buckle, a bolt, a screw, a rivet, a snap, a catch, a lock, or any other type of fastening or connecting mechanism.

What is claimed is:

1. A head-mounted-display cushion comprising:
a molded reticulated foam material;
a user-side surface dimensioned to abut a facial portion of a user;
a display-side surface dimensioned to abut a mounting surface of a facial-interface system for a head-mounted display;
a curved surface arcing from the user-side surface toward the display-side surface; and
a cooling channel that:
is formed by a protruding portion of an insertion mold member and that intersects the display-side surface;
extends into the head-mounted display cushion from the display-side surface; and
is dimensioned to allow for movement of air in the head-mounted display cushion in a manner that cools at least a portion of the head-mounted display cushion;
wherein the head-mounted display cushion defines an opening extending through an interior of the head-mounted-display cushion from the user-side surface to the display-side surface.

2. The head-mounted-display cushion of claim 1, wherein the curved surface defines at least a portion of the opening extending through the interior of the head-mounted-display cushion.

3. The head-mounted-display cushion of claim 2, further comprising:
an inner side surface defining at least a portion of the opening; and
a sloped surface sloping between the curved surface and the inner side surface.

4. The head-mounted-display cushion of claim 1, wherein the curved surface is located on at least a portion of an outer periphery of the head-mounted-display cushion.

5. The head-mounted-display cushion of claim 1, wherein the display-side surface comprises a generally planar surface.

6. The head-mounted-display cushion of claim 1, wherein a thickness of the head-mounted-display cushion is least in a region shaped to abut a nasal region of the facial portion of the user.

7. The head-mounted-display cushion of claim 1, wherein the molded reticulated foam material comprises a polyurethane material.

8. A head-mounted-display system comprising:
a head-mounted display; a facial-interface mounting member for the head-mounted display;
a facial-interface cushion abutting the facial-interface mounting member, the facial-interface cushion comprising;
a molded reticulated foam material;
a user-side surface dimensioned to abut a facial portion of a user;
a display-side surface dimensioned to abut the facial-interface mounting member;
a curved surface arcing from the user-side surface toward the display-side surface; and
a cooling channel that: is formed by a protruding portion of an insertion mold member and that intersects the display-side surface;
extends into the facial-interface cushion from the display-side surface; and is dimensioned to allow for movement of air in the facial-interface cushion in a manner that cools at least a portion of the facial-interface cushion;
wherein the facial-interface cushion defines an opening extending through an interior of the facial-interface cushion from the user-side surface to the display-side surface.

* * * * *